United States Patent [19]
Nakagawa et al.

[11] Patent Number: 5,332,920
[45] Date of Patent: Jul. 26, 1994

[54] DIELECTRICALLY ISOLATED HIGH AND LOW VOLTAGE SUBSTRATE REGIONS

[75] Inventors: Akio Nakagawa, Hiratsuka; Kazuyoshi Furukawa, Kawasaki; Tsuneo Ogura; Katsujiro Tanzawa, both of Yokohama, all of Japan

[73] Assignee: Kabushiki Kaisha Toshiba, Kawasaki, Japan

[21] Appl. No.: 850,964

[22] Filed: Mar. 11, 1992

Related U.S. Application Data

[63] Continuation of Ser. No. 732,575, Jul. 18, 1991, Pat. No. 5,097,314, which is a continuation of Ser. No. 486,395, Feb. 28, 1990, Pat. No. 5,049,968, which is a continuation-in-part of Ser. No. 307,770, Feb. 8, 1989, abandoned.

[30] Foreign Application Priority Data

Feb. 8, 1988 [JP] Japan .................................. 63-26787
Sep. 30, 1988 [JP] Japan ................................ 63-246441
May 16, 1989 [JP] Japan .................................. 1-122311
Aug. 7, 1989 [JP] Japan .................................. 1-202936
Dec. 11, 1989 [JP] Japan .................................. 1-318980

[51] Int. Cl.$^5$ ............................................. H01L 29/70
[52] U.S. Cl. ...................................... 257/501; 257/506; 257/513; 257/370; 257/140
[58] Field of Search ............... 257/500, 501, 506, 513, 257/370, 140

[56] References Cited

U.S. PATENT DOCUMENTS 3,500,139  3/1970  Frouin et al. ...................... 357/50
4,051,506  9/1977  Horie ................................... 357/49
4,261,003  4/1981  Magdo et al. ...................... 357/49
4,546,370  10/1985  Curran ................................ 357/41
4,725,561  2/1988  Haond et al. ..................... 257/506
4,851,078  7/1989  Short et al. ....................... 437/62
4,860,081  8/1989  Cogan ................................ 257/501
4,879,584  11/1989  Takagi et al. ..................... 257/500
4,897,362  1/1990  Delgado et al. .................. 257/506

FOREIGN PATENT DOCUMENTS 0217288  4/1987  European Pat. Off. .
0323856  7/1989  European Pat. Off. .

OTHER PUBLICATIONS

Patent Abstracts of Japan, vol. 9, No. 169 (E-328) [1982], Jul. 13, 1985; & JP-A-60 42 844 (Nippon Denki K.K.); Mar. 7, 1985.

Primary Examiner—Robert Limanek
Attorney, Agent, or Firm—Oblon, Spivak, McClelland, Maier & Neustadt

[57] ABSTRACT

A dielectric isolation substrate comprises a first semiconductor wafer, a second semiconductor wafer bonded on the first semiconductor wafer with a first insulating layer interposed therebetween, a semiconductor layer formed on the second semiconductor wafer, a first groove formed in the semiconductor layer and the second semiconductor wafer so as to reach the first insulating layer, thereby isolating the semiconductor layer and the second semiconductor wafer, and a second insulating layer formed on the side face of the first groove or embedded in the first groove. In this dielectric isolation substrate, a high breakdown voltage element and a low breakdown voltage element are formed in a region isolated by the first groove.

26 Claims, 39 Drawing Sheets

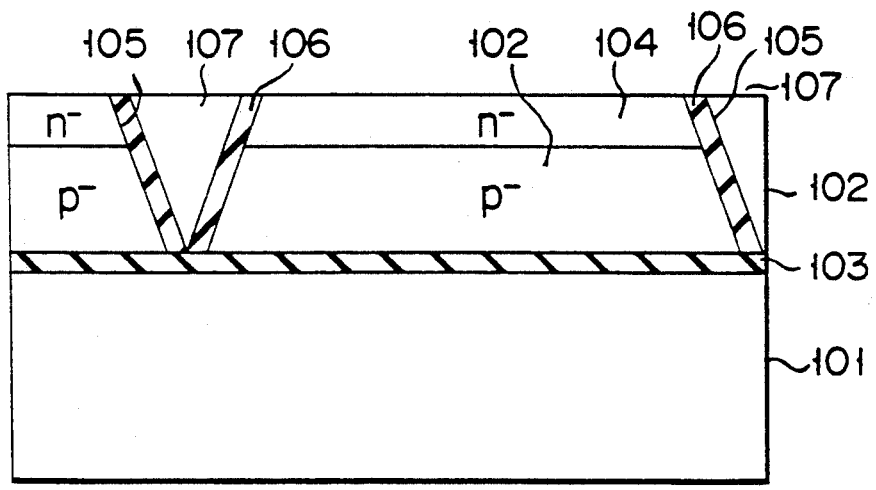
F I G. 2

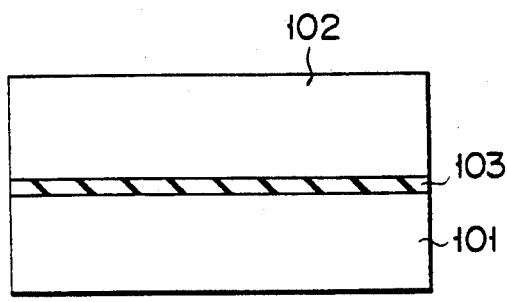
F I G. 3A
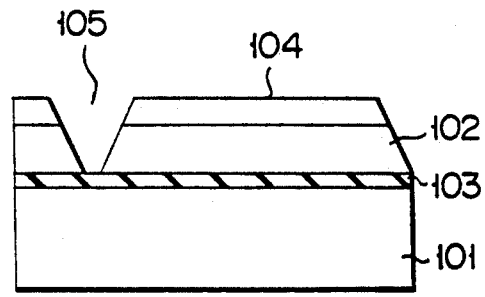
F I G. 3D
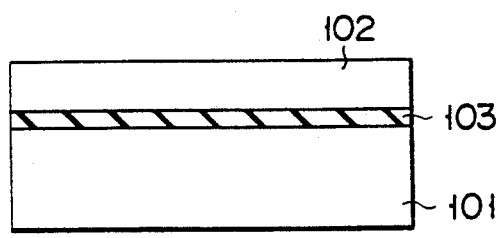
F I G. 3B
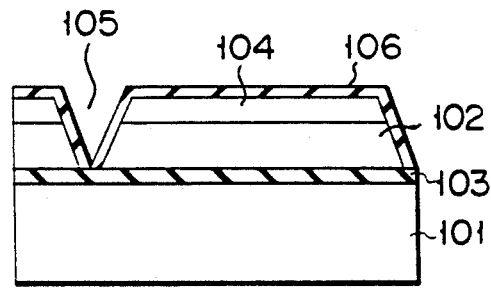
F I G. 3E
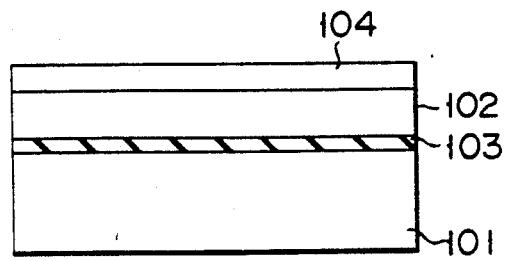
F I G. 3C
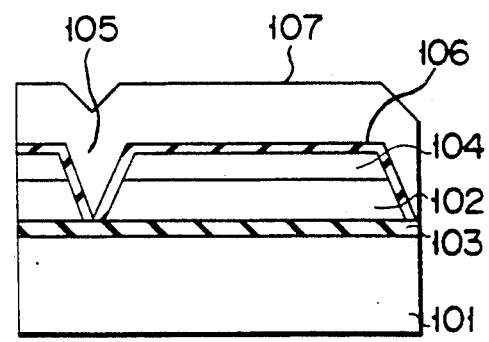
F I G. 3F

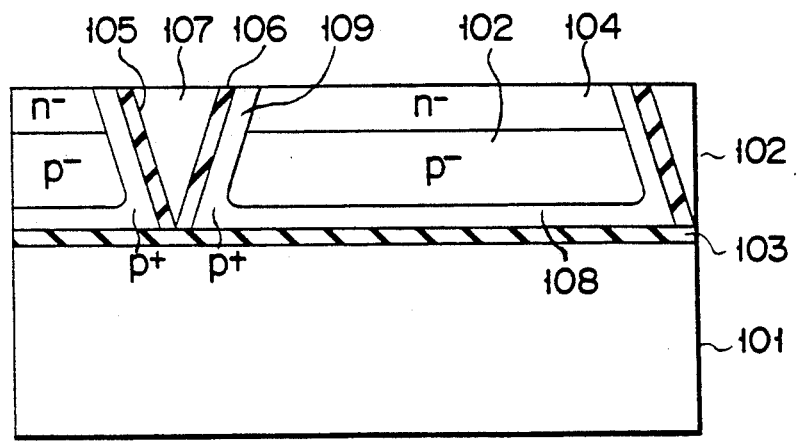
F I G. 4
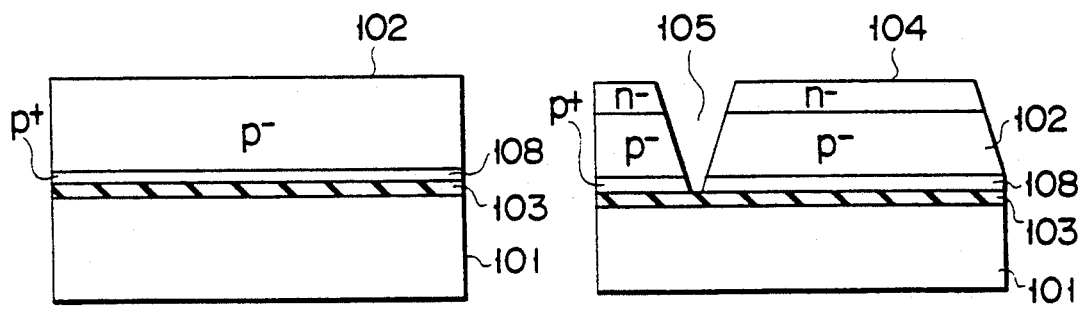
F I G. 5A　　　F I G. 5C
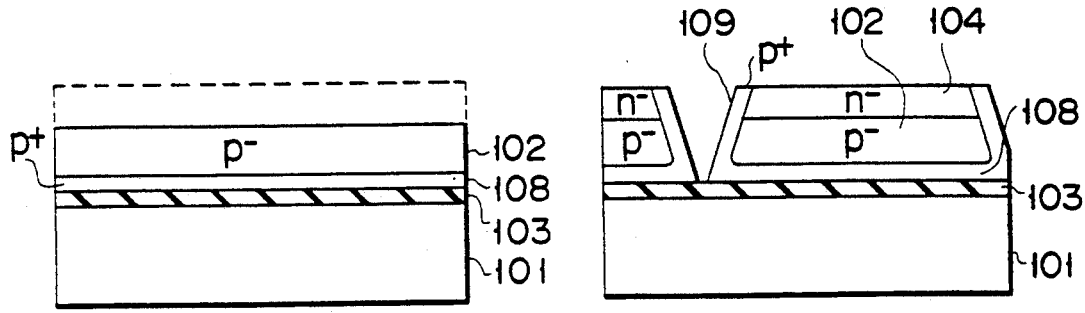
F I G. 5B　　　F I G. 5D

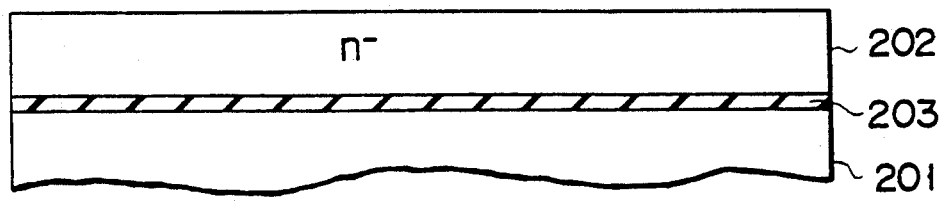
F I G. 8A
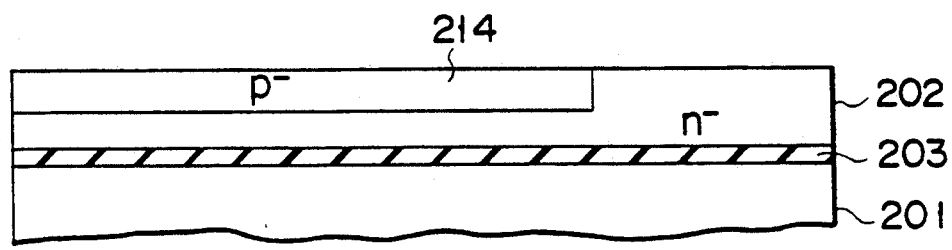
F I G. 8B
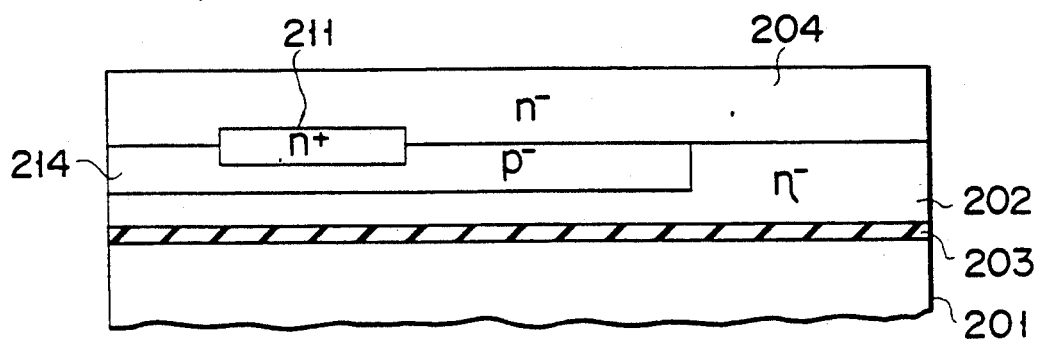
F I G. 8C
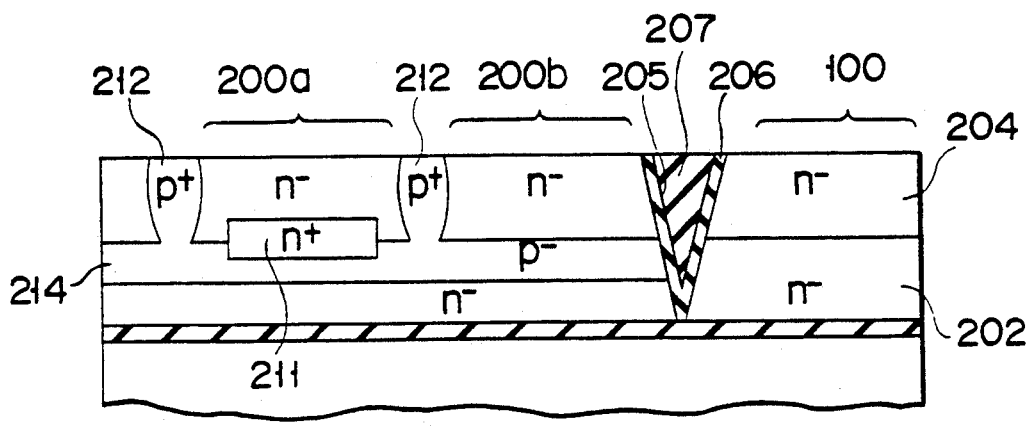
F I G. 8D

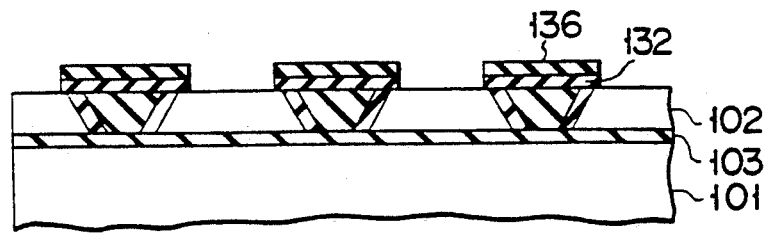
F I G. 10D
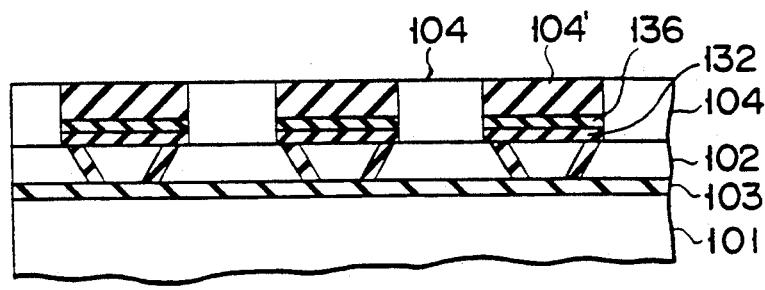
F I G. 10E
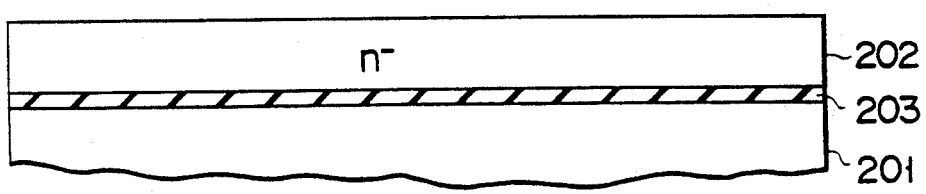
F I G. 11A
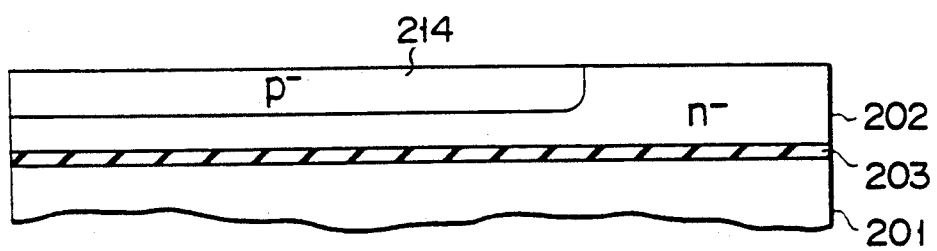
F I G. 11B
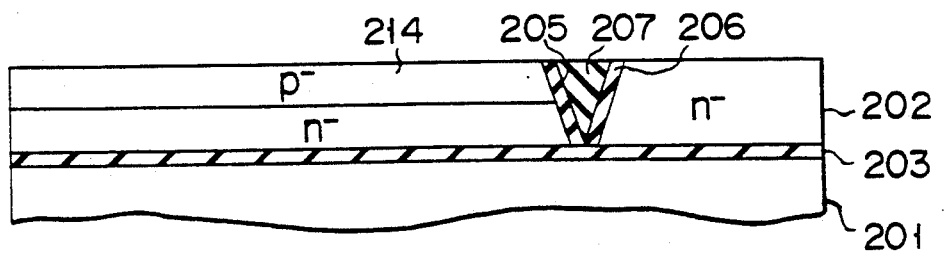
F I G. 11C

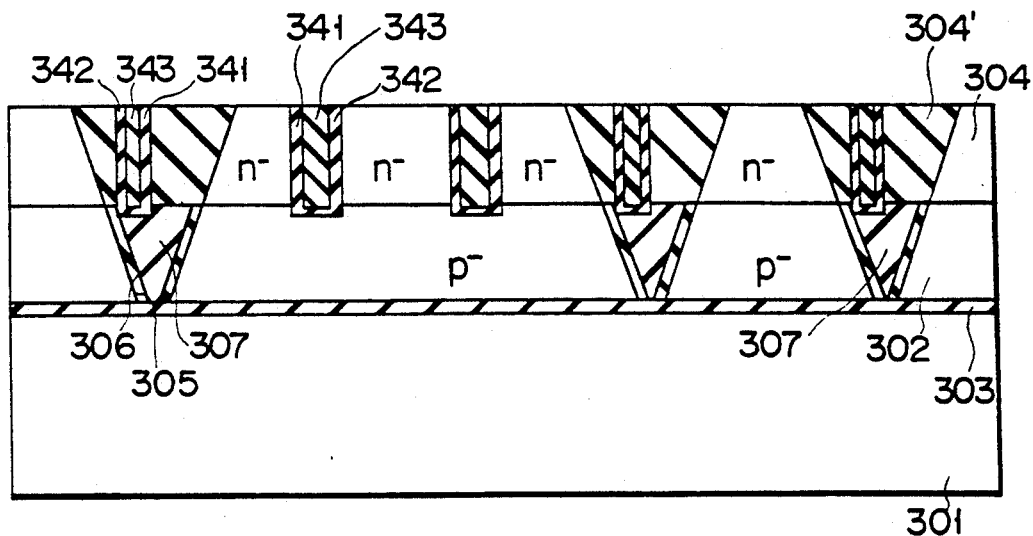
F I G. 14
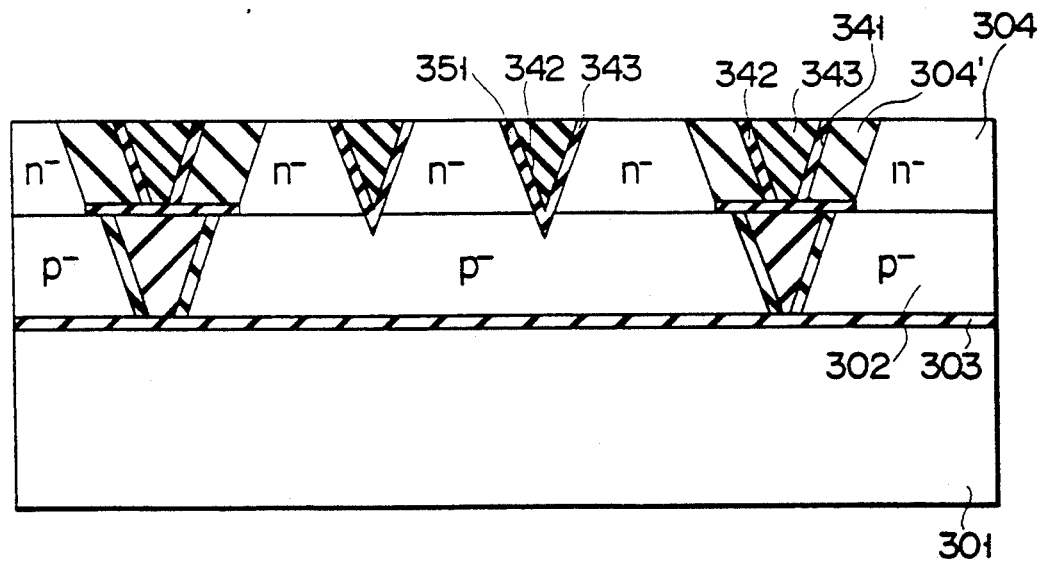
F I G. 15

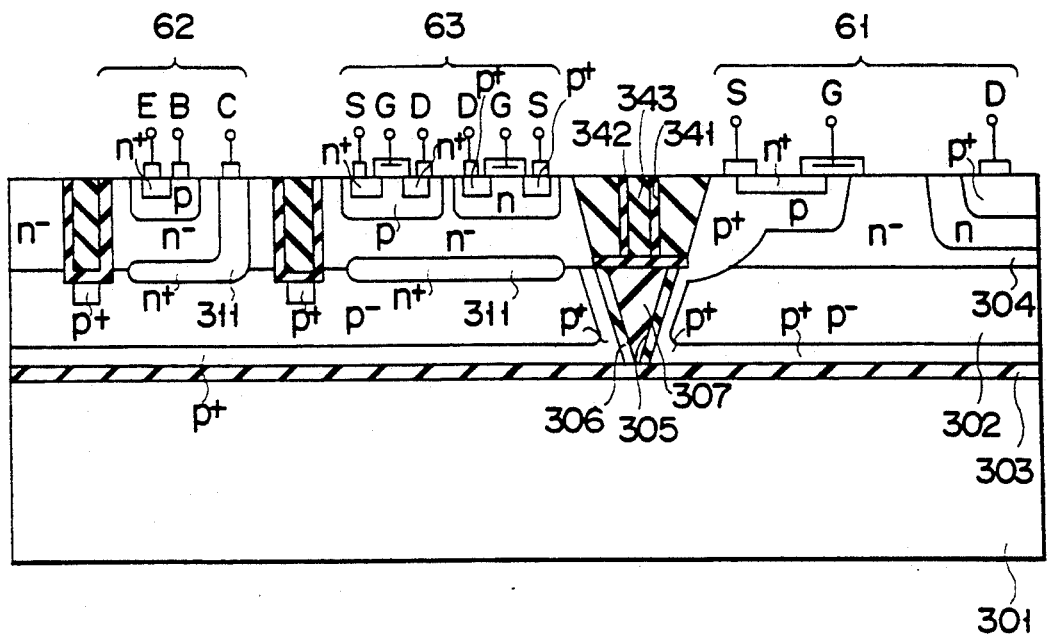
F I G. 16
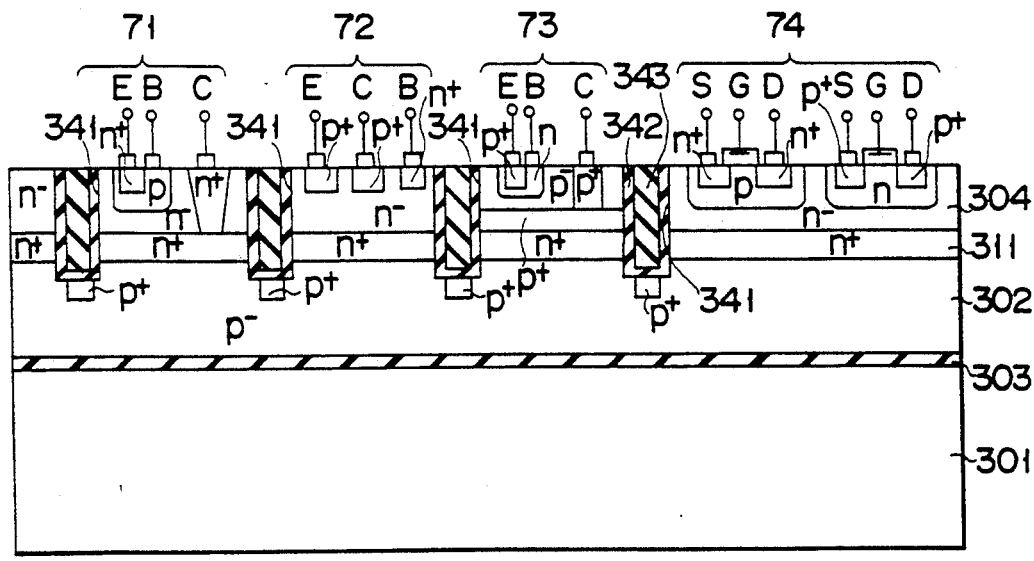
F I G. 17

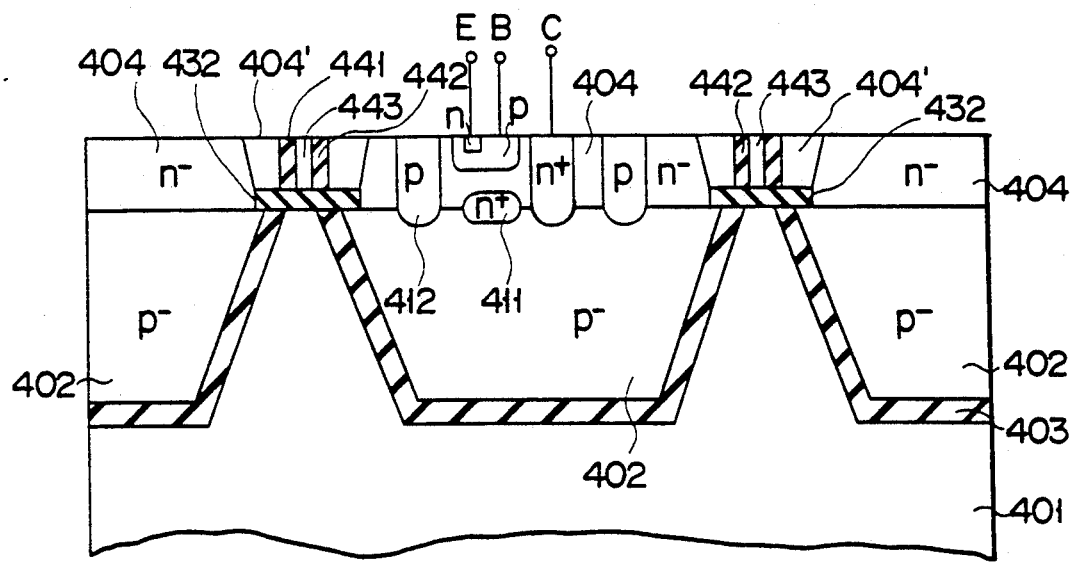
F I G. 18
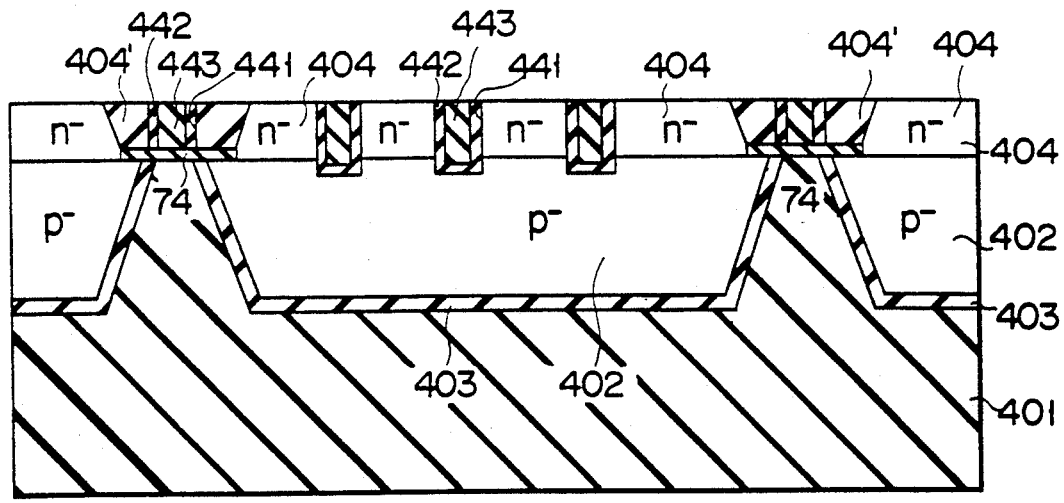
F I G. 19

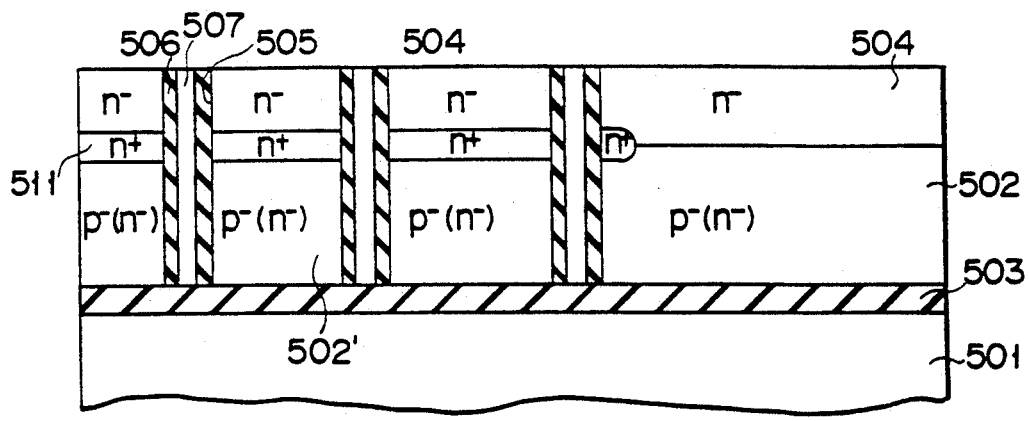
FIG. 20
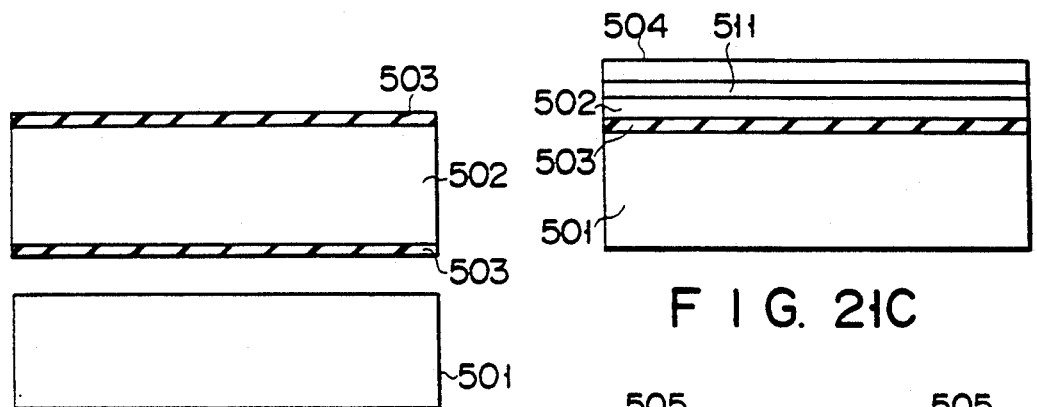
FIG. 21A
FIG. 21C
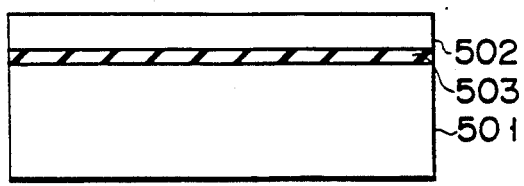
FIG. 21B
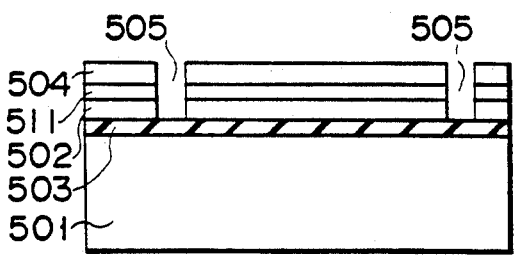
FIG. 21D
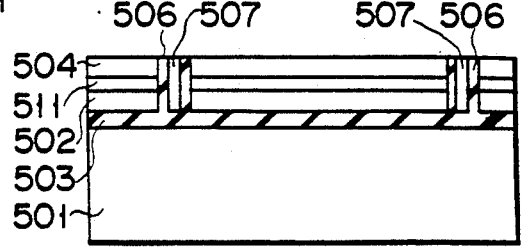
FIG. 21E

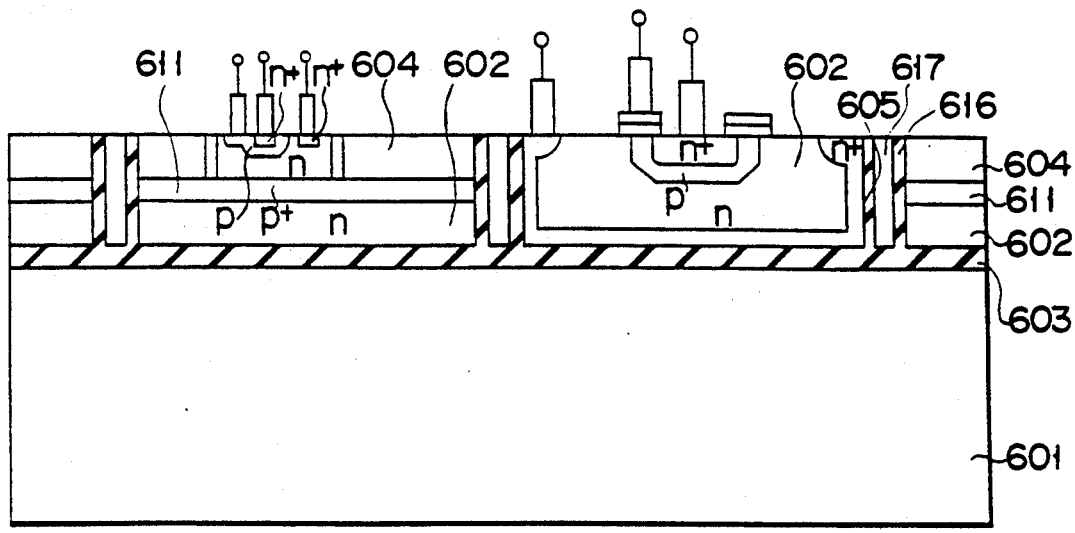
F I G. 22
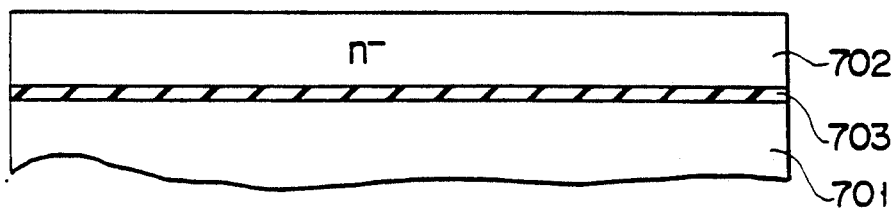
F I G. 23A
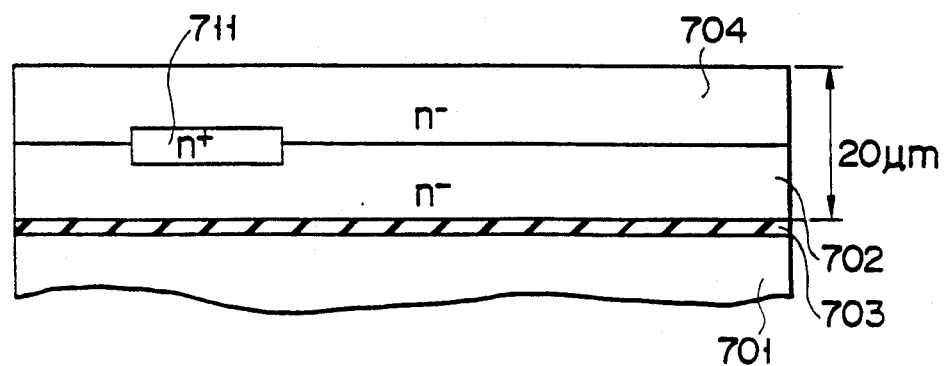
F I G. 23B

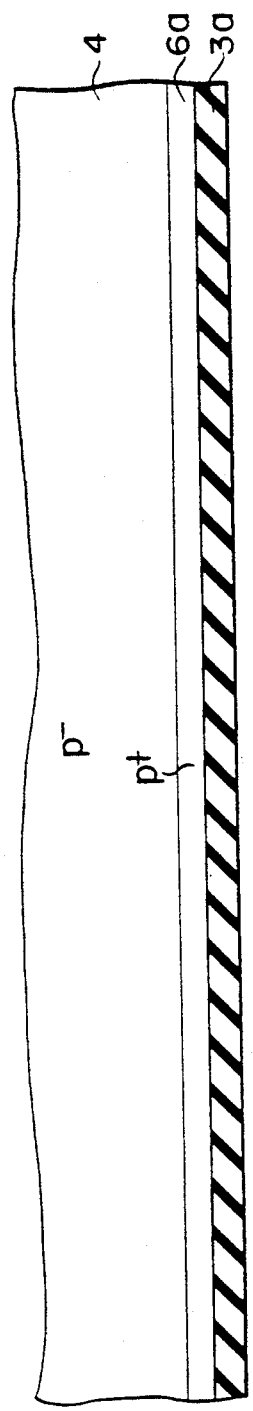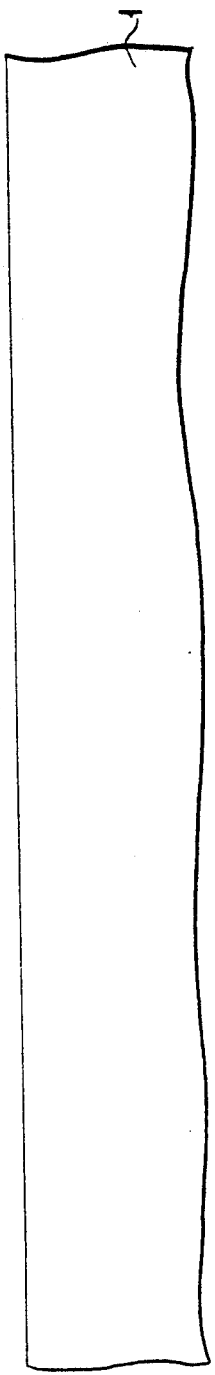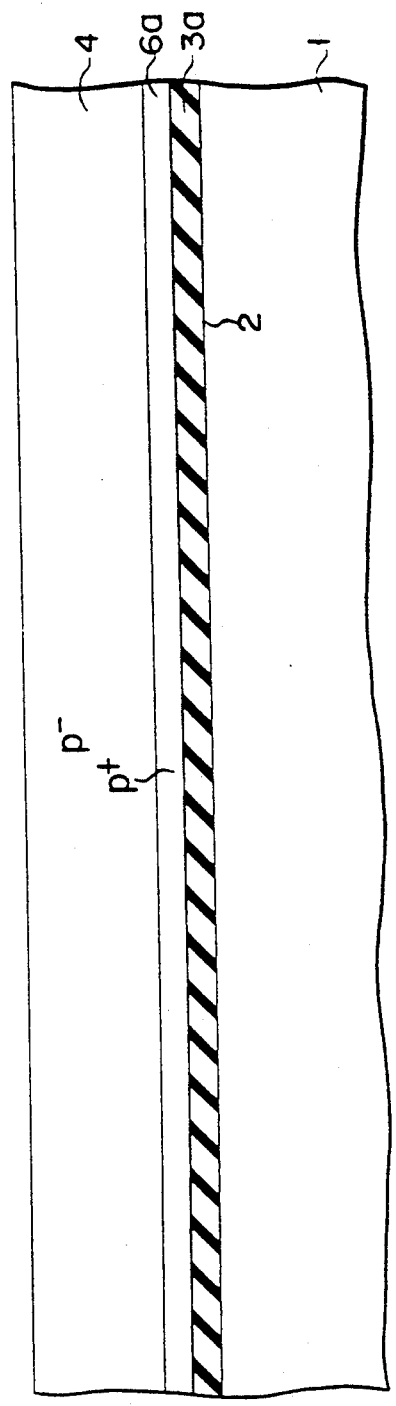
F I G. 26A
F I G. 26B

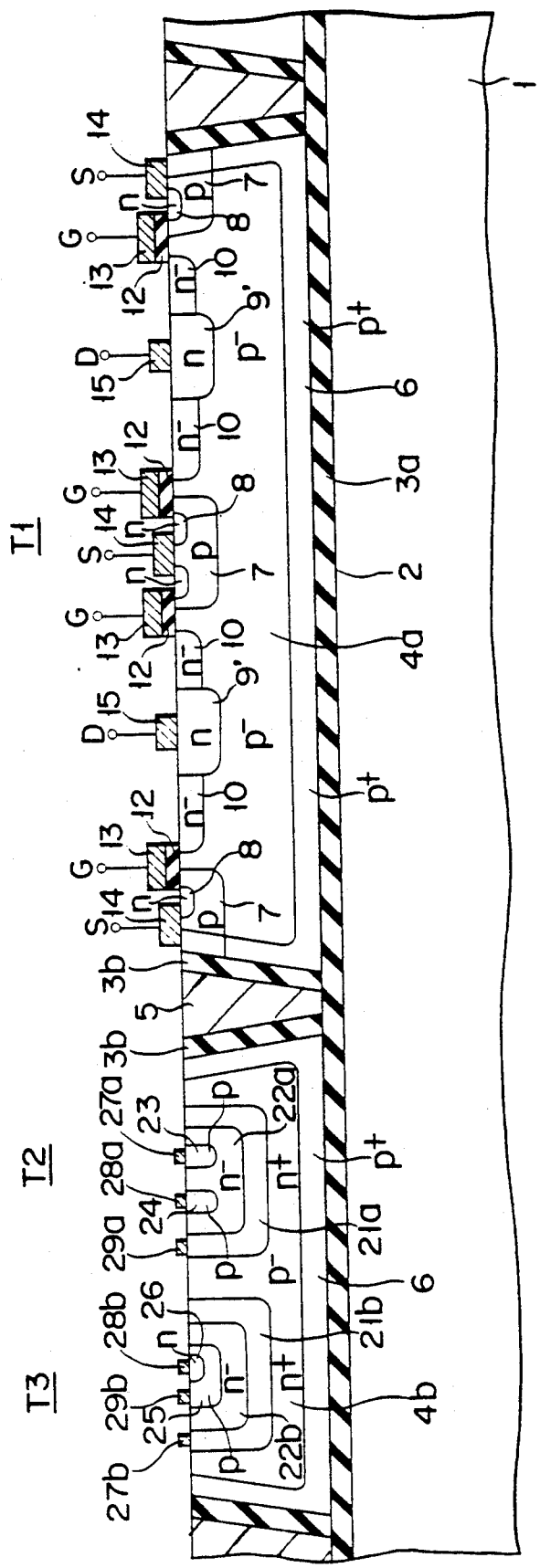
F I G. 28

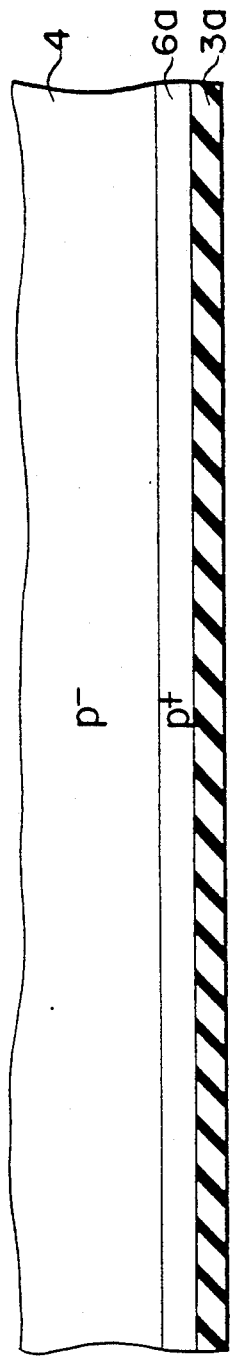
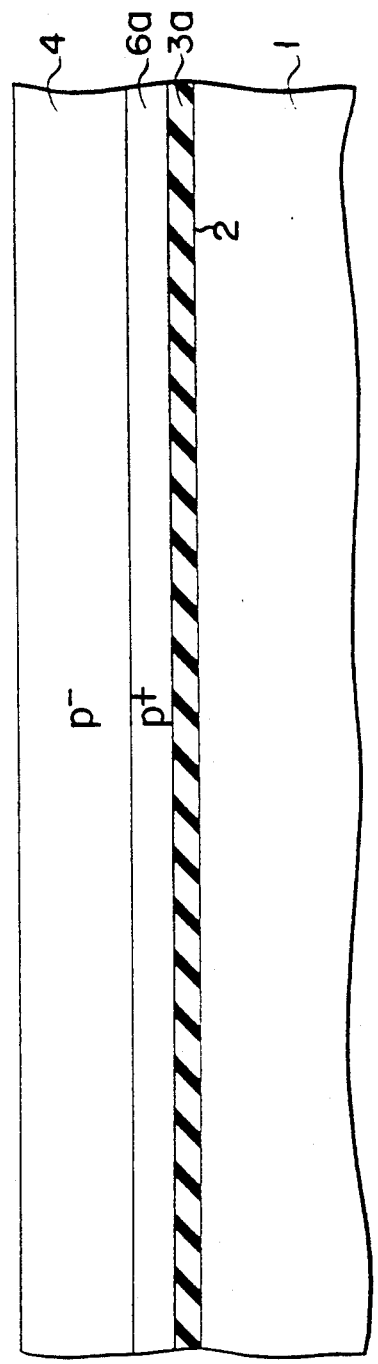
F I G. 36A
F I G. 36B

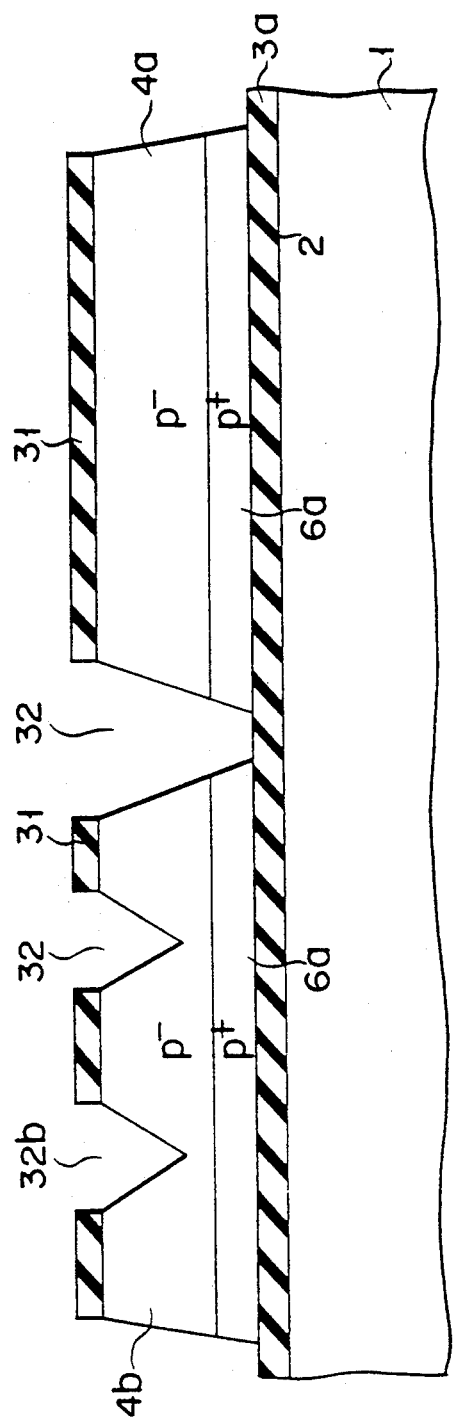
F I G. 36C
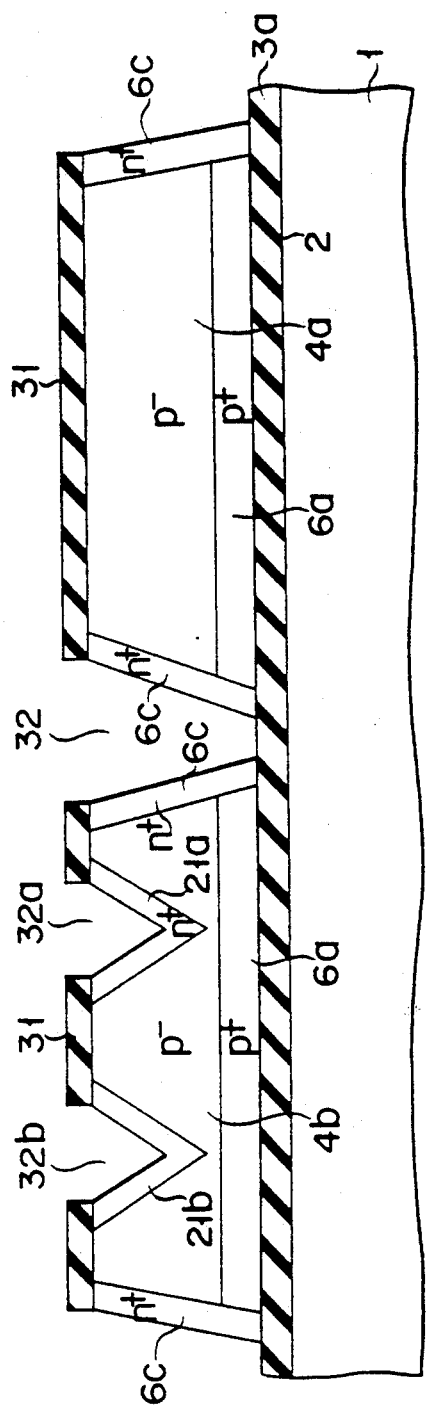
F I G. 36D

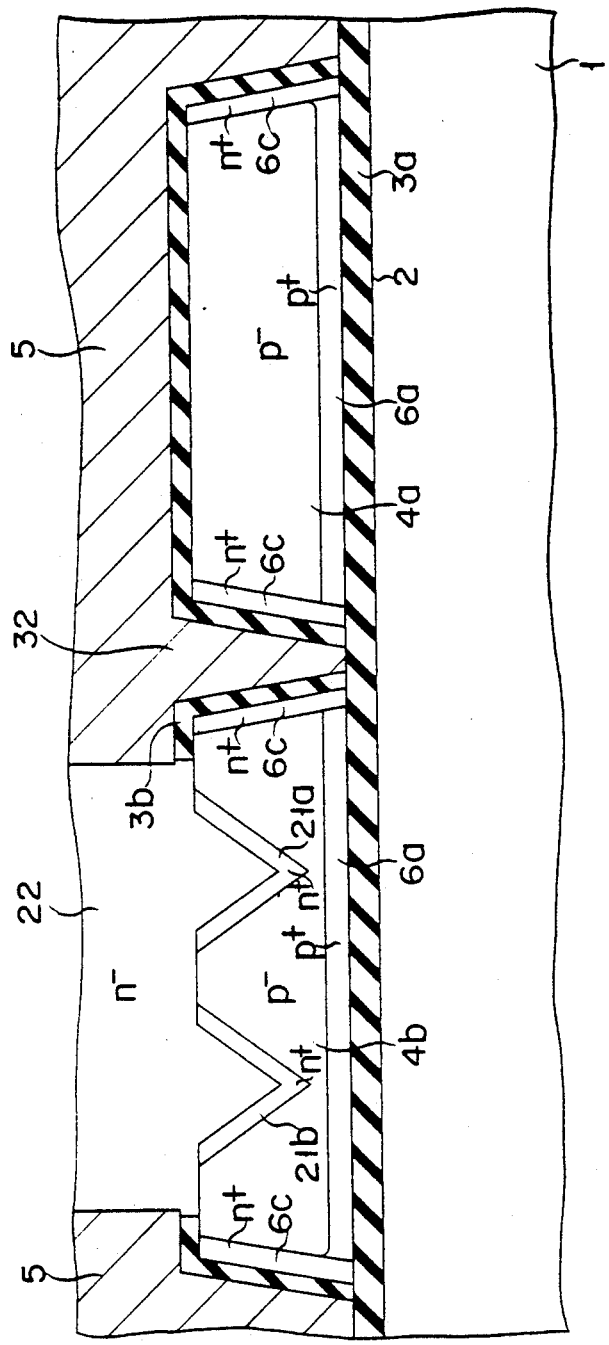
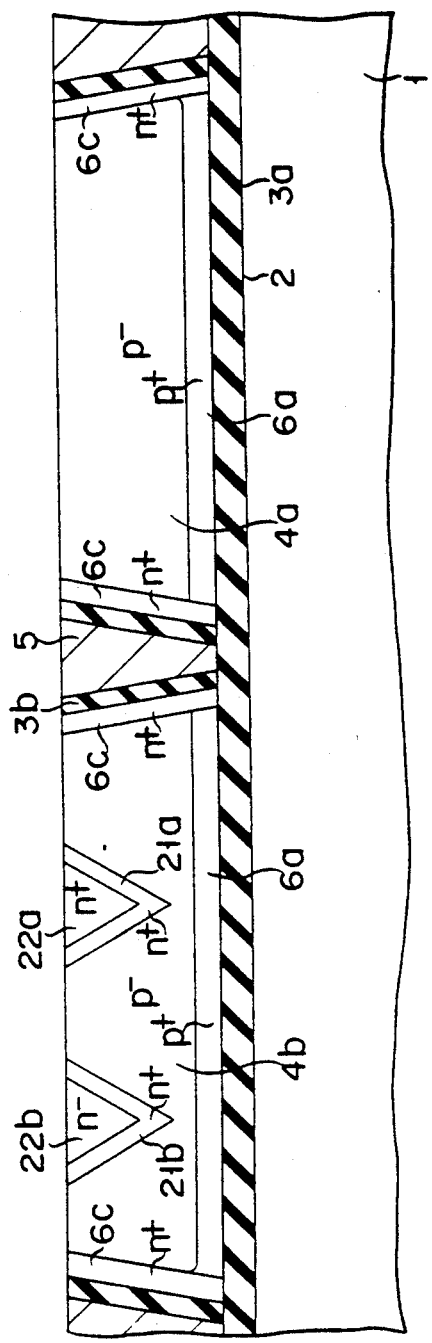
FIG. 36E
FIG. 36F

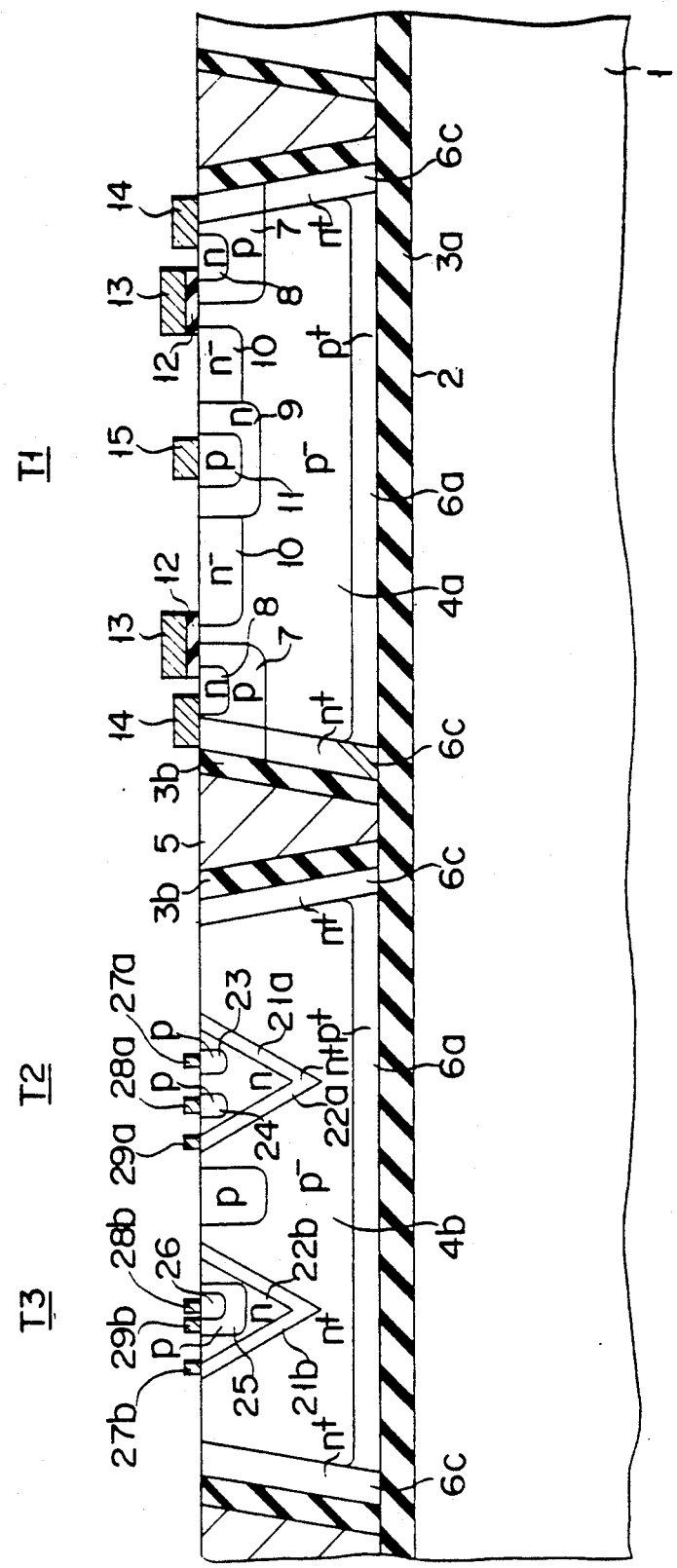
F I G. 36G

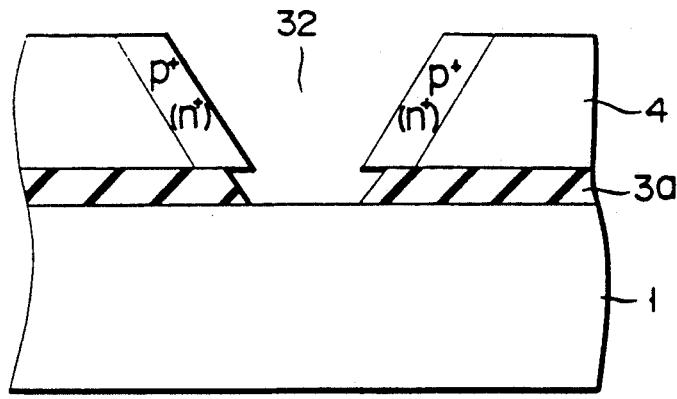
F I G. 39A
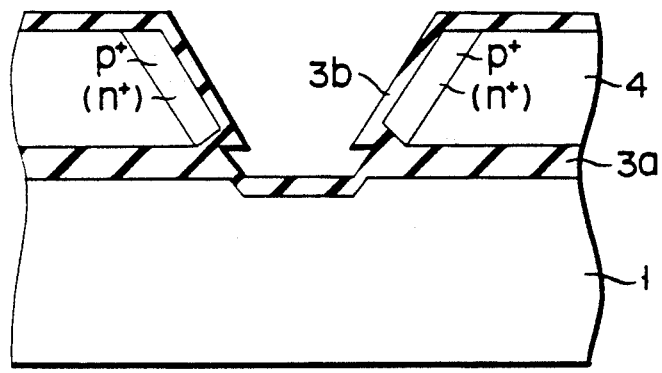
F I G. 39B
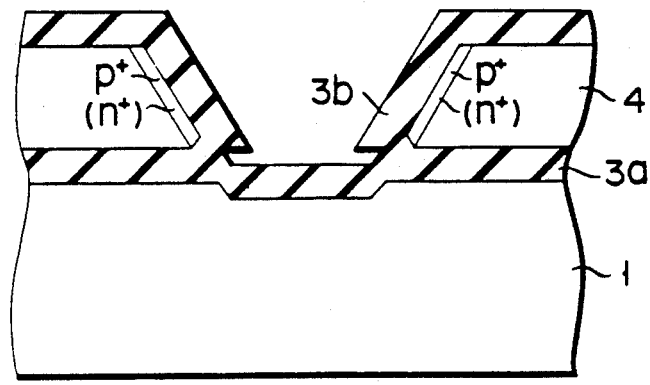
F I G. 39C

DIELECTRICALLY ISOLATED HIGH AND LOW VOLTAGE SUBSTRATE REGIONS

CROSS-REFERENCES TO THE RELATED APPLICATIONS

This is a continuation of application Ser. No. 07/732,575, filed on Jul. 18, 1991, now U.S. Pat. No. 5,097,314 which is a continuation of Ser. No. 07/486,395, filed Feb. 28, 1990 which is a continuation-in-part of Ser. No. 07/307,770, filed Feb. 8, 1989, now abandoned.

BACKGROUND OF THE INVENTION

1. Field of the Invention

The present invention relates generally to a dielectric isolation technique, and more particularly to a dielectrically isolated semiconductor substrate wherein two semiconductor wafers are bonded to each other with an insulating layer interposed therebetween, and to a method of manufacturing the same.

2. Description of the Related Art

There is conventionally known a direct bonding technique for bonding two semiconductor wafers thereby to attain dielectric isolation of a semiconductor device. According to this technique, as shown in FIG. 1, an insulating layer 103 is formed on the surface of a first wafer 101 and/or the surface of a second wafer 102. The insulating layer 103 is interposed and bonded between the first and second wafers 101 and 102. After reducing the thickness of the second silicon wafer 102, a v-shaped groove 105 is formed in the second silicon wafer 102, and oxide layers 106 are formed on the side faces of the groove 105. Thus, a portion 102' of the second silicon wafer 2 is dielectrically isolated, in an island shape, from the other part of the wafer 102.

In the structure shown in FIG. 1, when a CMOS device is used as a logic circuit, many CMOS logic circuits can be formed in a single island region. However, when a bipolar device is used as a logic circuit, it becomes necessary to isolate each logic circuit by means of the v-shaped groove. Consequently, the number of v-shaped grooves increases, and a large area is occupied by the grooves. Thus, the area for forming the devices is reduced. The structure shown in FIG. 1 is therefore unsuitable.

Also, when both a low breakdown voltage device (e.g. a bipolar device) and a high breakdown voltage device (e.g. a DMOS device) are formed in the dielectrically isolated semiconductor substrate shown in FIG. 1, the following problem occurs. Namely, in forming the DMOS device, the thickness of the substrate needs to be increased to a relatively high value in order to obtain a high breakdown voltage. On the other hand, in forming the bipolar device, it is necessary to decrease the thickness of the substrate in order to achieve a high speed operation. It is therefore difficult to attain the thickness of the substrate which is desirable both for the bipolar device and the DMOS device.

SUMMARY OF THE INVENTION

An object of the present invention is to provide a dielectrically isolated semiconductor substrate suitable for the case wherein both a high breakdown voltage device and a low breakdown voltage are formed on a single substrate.

Another object of the invention is to provide a method of manufacturing such a dielectrically isolated semiconductor substrate.

Still another object of the invention is to provide a semiconductor device using such a dielectrically isolated semiconductor substrate.

According to one aspect of the invention, there is provided a dielectric isolation substrate comprising: a first semiconductor wafer; a second semiconductor wafer bonded on said first semiconductor wafer with a first insulating layer interposed therebetween; a semiconductor layer formed on the second semiconductor wafer; a first groove formed in said semiconductor wafer and said second semiconductor wafer so as to reach said insulating layer, thereby isolating the semiconductor layer and the second semiconductor wafer; and a second insulating layer formed on the side face of the first groove or embedded in the first groove.

According to another aspect of the invention, there is provided a semiconductor device comprising: a first semiconductor wafer; a second semiconductor wafer bonded on said first semiconductor wafer with a first insulating layer interposed therebetween; a semiconductor layer formed on the second semiconductor wafer; a groove formed in said semiconductor wafer and said second semiconductor wafer so as to reach said insulating layer, thereby isolating the semiconductor layer and the second semiconductor wafer; a second insulating layer formed on the side surface of the groove or embedded in the first groove; a high breakdown voltage element formed in said semiconductor layer; and a low breakdown voltage element formed in said semiconductor layer.

According to still another aspect of the invention, there is provided a method of manufacturing a dielectric isolation substrate comprising the steps of: bonding first and second semiconductor wafers, the surface of at least one of which is provided with a first insulating layer, such that the first insulating layer is interposed between the first and second semiconductor wafers; forming an epitaxially grown layer on the second semiconductor wafer; forming a first groove in the epitaxially grown layer and the second semiconductor wafer so as to reach the first insulating layer, thereby isolating the epitaxially grown layer and the second semiconductor wafer into a plurality of regions; and forming a second insulating layer on the side surface of said first groove or embedding the second insulating layer in the first groove.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a cross-sectional view showing a structure of a dielectrically isolated semiconductor substrate according to a first embodiment of the present invention;

FIGS. 3A to 3F are cross-sectional views illustrating the steps of manufacturing the dielectrically isolated semiconductor substrate shown in FIG. 2;

FIG. 4 is a cross-sectional view showing a structure of a dielectrically isolated semiconductor substrate according to a second embodiment of the invention;

FIGS. 5A to 5D are cross-sectional views illustrating the steps of manufacturing the dielectrically isolated semiconductor substrate shown in FIG. 4;

FIGS. 8A to 8D are cross-sectional views illustrating the steps of manufacturing a dielectrically isolated semiconductor substrate according to a fifth embodiment;

FIGS. 10A to 10E are cross-sectional views illustrating the steps of manufacturing the dielectrically isolated semiconductor substrate shown in FIG. 9;

FIGS. 11A to 11E are cross-sectional views illustrating the steps of manufacturing a dielectrically isolated semiconductor substrate according to a seventh embodiment of the invention;

FIG. 14 is a cross-sectional view showing a structure of a dielectrically isolated semiconductor substrate according to a ninth embodiment of the invention;

FIG. 15 is a cross-sectional view showing a structure of a dielectrically isolated semiconductor substrate according to a tenth embodiment of the invention;

FIG. 16 is a cross-sectional view showing a structure of a dielectrically isolated semiconductor substrate according to an eleventh embodiment of the invention;

FIG. 17 is a cross-sectional view showing a structure of a dielectrically isolated semiconductor substrate according to a twelfth embodiment of the invention;

FIG. 18 is a cross-sectional view showing a structure of a dielectrically isolated semiconductor substrate according to a 13th embodiment of the invention;

FIG. 19 is a cross-sectional view showing a structure of a dielectrically isolated semiconductor substrate according to a 14th embodiment of the invention;

FIG. 20 is a cross-sectional view showing a structure of a dielectrically isolated semiconductor substrate according to a 15th embodiment of the invention;

FIGS. 21A to 21E are cross-sectional views illustrating the steps of manufacturing a dielectrically isolated semiconductor substrate according to a 16th embodiment of the invention;

FIG. 22 is a cross-sectional view showing a structure of a dielectrically isolated semiconductor substrate according to a 17th embodiment of the invention;

FIGS. 23A to 23D are cross-sectional views illustrating the steps of manufacturing a dielectrically isolated semiconductor substrate according to an 18th embodiment of the invention;

FIGS. 26A to 26G are sectional views showing the steps in manufacturing the semiconductor device in FIG. 25;

FIG. 28 is a sectional view of a semiconductor device in which a lateral MOSFET is used as a high breakdown voltage element;

FIGS. 36A to 36G are sectional views showing the steps in manufacturing the semiconductor device in FIG. 35;

FIGS. 39A to 39C are sectional views for explaining a modification of the present invention.

DETAILED DESCRIPTION OF THE PREFERRED EMBODIMENTS

Figure 1:
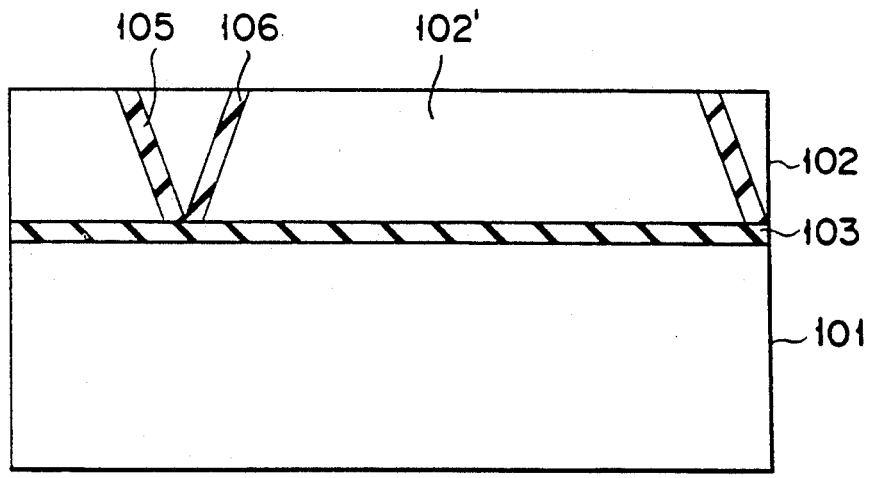
FIG. 1 is a cross-sectional view schematically showing a structure of a conventional dielectrically isolated semiconductor substrate.

Various embodiments of the present invention will now be described with reference to the accompanying drawings.

FIG. 2 schematically shows a structure of a dielectrically isolated semiconductor substrate according to a first embodiment of the present invention. In FIG. 2, reference numeral 101 denotes a first silicon wafer serving as a support (i.e. a support wafer). A second silicon wafer (i.e. a wafer for formation of devices) 102 serving as a $p^-$ layer is bonded to the wafer 101 with an oxide film (insulating layer) 103 interposed therebetween. As is well known, the bonding of the two silicon wafers 101 and 102 is effected such that the surfaces of the wafers 101 and 102 are polished and an oxide film is formed on at least one of the polished surfaces, for example, by means of thermal oxidation. The polished surfaces, being kept clean, are superposed on each other. An $n^-$ epitaxial layer 104 is grown on the $p^-$ layer 102. A V-groove 105 is formed in the layers 102 and 104. An oxide film 106 is formed on the side surface of the V-groove 105. A polycrystalline silicon film 107 is filled in the V-groove 105. Then, an MOS device, a bipolar device, etc. are formed in the $n^-$ epitaxial layer 104.

FIGS. 3A to 3F are cross-sectional views illustrating the process of manufacturing the dielectrically isolated semiconductor substrate shown in FIG. 2. First, as shown in FIG. 3A, two silicon wafers 101 and 102, each having at least one polished surface, are prepared. An oxide film 103 is formed on the surface of at least one of the wafers 101 and 102. Subsequently, the wafers 101 and 102 are directly bonded as one body. Then, as shown in FIG. 3B, the thickness of the silicon wafer 102 serving as a p⁻ layer is reduced to a predetermined value. The thin layer 102 is isolated from the support wafer 101 by means of the oxide film 103. In the step shown in FIG. 3C, an n⁻ epitaxial layer 104 is grown on the layer 102.

As shown in FIG. 3D, the epitaxial layer 104 and the layer 102 are selectively etched, to form a V-groove 105 extending from the surface of the epitaxial layer 104 to the oxide film 103. Then, as shown in FIG. 3E, an oxide film 106 is formed on the entire surface of the resultant structure including the side faces of the V-groove 105, thus separating the layer 102 in the lateral direction. A polycrystalline silicon is deposited on the entire surface of the resultant structure and is lapped or etch-backed of fill the V-groove. Thus, the surface of the resultant structure is flattened to obtain the dielectrically isolated semiconductor substrate shown in FIG. 2.

In the semiconductor substrate with the above structure, it is not always necessary to employ a dielectric isolation for isolation of devices. In order to isolate logic devices, a conventional pn junction isolation technique may be employed, thereby increasing the density of devices, compared to the case where many large V-grooves are used. In this technique, a high breakdown voltage MOSFET can be formed in the same island region as a MOS logic device, and the source potential can be set to a value different from the substrate potential of the island region. The V-groove is used mainly for dielectrically isolating a high breakdown voltage device from a bipolar logic device. Thus, the area occupied by the V-grooves can be reduced.

FIG. 4 is a cross-sectional view schematically showing a structure of a dielectrically isolated substrate according to a second embodiment of the invention. The reference numerals used in FIG. 2 denote the same elements, and detailed descriptions thereof are omitted. The second embodiment differs from the first embodiment in that a p⁺ layer 108 is formed under the layer 102, and a p⁺ layer 109 is formed on the side faces of the epitaxial layer 104 and the layer 102. Namely, the p⁺ layer 108 is formed in the interface of the p⁻ layer 102 and the oxide film 103, and the p⁺ layer 109 is formed on the side surfaces of the V-groove 105.

FIGS. 5A to 5D are cross-sectional views illustrating the process of manufacturing the dielectrically isolated substrate shown in FIG. 4. As shown in FIG. 5A, a p⁻ silicon wafer 102 having a p⁺ layer 108 on its surface, and a silicon wafer 101 serving as a support, are prepared. An oxide film 103 is formed on at least one of the wafers 102 and 101. Then, the wafers 101 and 102 are bonded to each other with the oxide film 103 interposed therebetween. In the subsequent step shown in FIG. 5B, the wafer 102 is polished to a desired thickness. In FIG. 5C, an n⁻ epitaxial layer 104 is grown on the layer 102 and a V-groove 105 is formed. In the step shown in FIG. 5D, a p⁺ layer 109 is formed on the side surfaces of the V-groove 105. Then, not shown, an oxide film 106 is formed on the side surfaces of the V-groove 105, and a polycrystalline silicon film 107 is embedded in the V-groove 105. Thus, the structure of FIG. 4 can be obtained.

In this structure, an electric contact with the p⁻ layer 102 is established by providing the p⁺ layer 108 under the p⁻ layer 102. Thus, the latch-up of the CMOS can be prevented. Also, since the p⁺ layer 109 is formed on the side surfaces of the V-groove 105, an electrode can be taken from the p⁺ layer 109.

Figure 6:
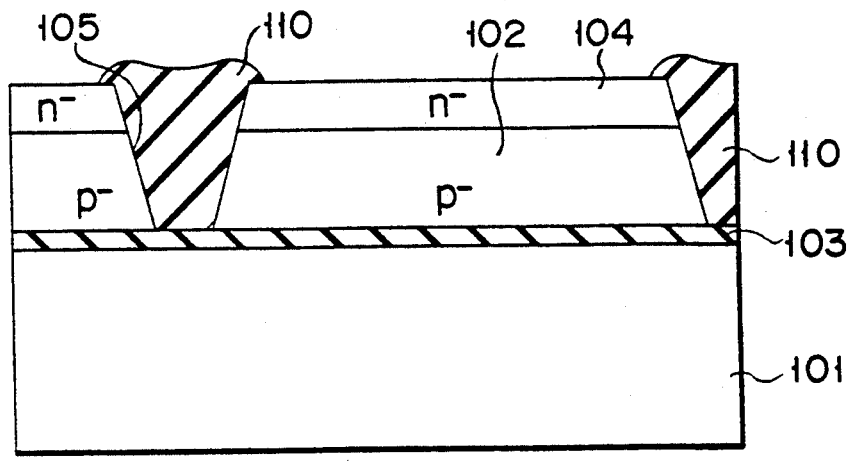
FIG. 6 is a cross-sectional view showing a structure of a dielectrically isolated semiconductor substrate according to a third embodiment of the invention.

FIG. 6 is a cross-sectional view schematically showing a structure of a dielectrically isolated substrate according to a third embodiment of the invention. The reference numerals used in FIG. 2 denote the same elements, and detailed descriptions thereof are omitted.

The third embodiment differs from the first embodiment in that the oxide film formed on the side faces of the V-groove and the polycrystalline silicon film embedded in the V-groove are replaced with an organic insulating film of, e.g. polyimide resin, for dielectric isolation. In the first embodiment, when the polycrystalline silicon film 107 is wrapped, the initial thickness of the n-$_{epitaxial}$ layer 104 varies and it is difficult to keep a uniform thickness. In the third embodiment, the V-groove 105 is formed after devices are formed in the n⁻ epitaxial layer 104 and main thermal processes are completed. An organic insulating film 110 of, e.g. polyimide, is embedded in the V-groove 105. After the surface of the resultant structure, metal wiring is carried out.

According to the third embodiment, the thickness of the n⁻ epitaxial layer 104 does not vary, and the thickness of the n⁻ epitaxial layer 104 can be made uniform. The V-groove 105 may be formed after the metal wiring has been completed. In this case, it is not always necessary to flatten the organic insulating film 110. The wiring over the regions isolated by the V-105 may be carried out by means of wire bonding, etc.

Figure 7:
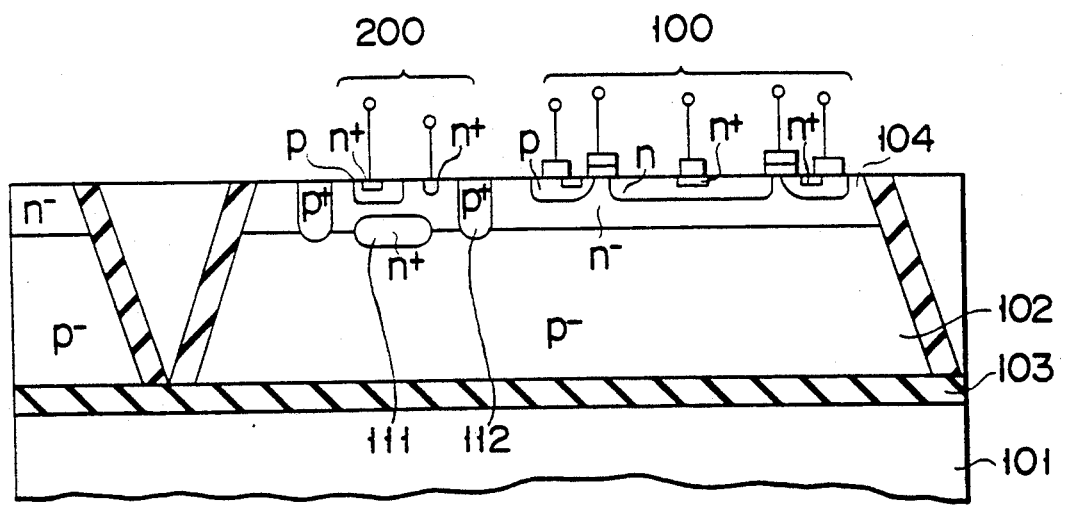
FIG. 7 is a cross-sectional view showing a structure of a dielectrically isolated semiconductor substrate according to a fourth embodiment of the invention.

FIG. 7 is a cross-sectional view schematically showing a structure of semiconductor devices according to a fourth embodiment of the invention. The reference numerals used in FIG. 2 denote the same elements, and detailed descriptions thereof are omitted. The devices according to this embodiment are formed in the dielectrically isolated substrate shown in FIG. 2. Namely, a DMOS device functioning as a high breakdown voltage device and a bipolar device functioning as a low breakdown voltage device are formed in the same island region.

More specifically, an npn bipolar element 200 and an n-channel high breakdown voltage MOS device 100 are formed in the n⁻ epitaxial layer 104. The bipolar device 200 is isolated by pn-junctions which are formed by providing n⁺ layers 104 and 111 and a p⁺ layer 112.

With the above structure, the high breakdown voltage MOS device 100 has a two-layer structure of the p⁻ layer 102 and the n⁻ epitaxial layer 104. Since the relatively thick p⁻ layer 102 is located in the lower part of the two-layer structure, the breakdown voltage of the MOS device 100 can be increased effectively. The bipolar device 200 is equivalent to a device formed in a thin substrate, by virtue of the n⁺ embedded layer 111 provided between the p⁻ layer 102 and the n⁻ epitaxial layer 104; therefore, a high-speed operation of the bipolar device 200 can be realized.

FIGS. 8A to 8D are cross-sectional views illustrating the process of manufacturing semiconductor devices according to a fifth embodiment of the invention. As shown in FIG. 8A, silicon wafers 201 and 202 are bonded to each other with an oxide film 203 interposed therebetween. The thickness of the upper silicon wafer 202 is reduced to a predetermined value, to form an n⁻ layer 202. Then, as shown in FIG. 8B, a p⁻⁻layer 214 is formed in a portion of the layer 202. In the step shown in FIG. 8C, an n⁺ layer 211 is formed in a surface portion of the player 214, and an n⁻⁻layer 204 is epitaxially grown on the entire surface of the resultant structure.

Subsequently, as shown in FIG. 8D, a V-groove 205 is formed and an oxide film 206 is formed on the side faces of the V-groove 205. A polycrystalline silicon film 207 is embedded in the V-groove 205. P+ layers 212 for isolating devices are formed in the n⁻ epitaxial layer 204. A high breakdown voltage device 100 and low breakdown voltage devices 200A and 200B are formed in regions of the n⁻ epitaxial layer 204 which are isolated by the V-groove 205. Unlike in FIG. 6, in the embodiment of FIGS. 7 and 8A to 8D, the high breakdown voltage device 100 is isolated from the low breakdown voltage devices 200a and 200b by means of the V-groove, while the low breakdown voltage device 200a is isolated from the low breakdown voltage device 200b by means of a pn junction.

Figure 9:
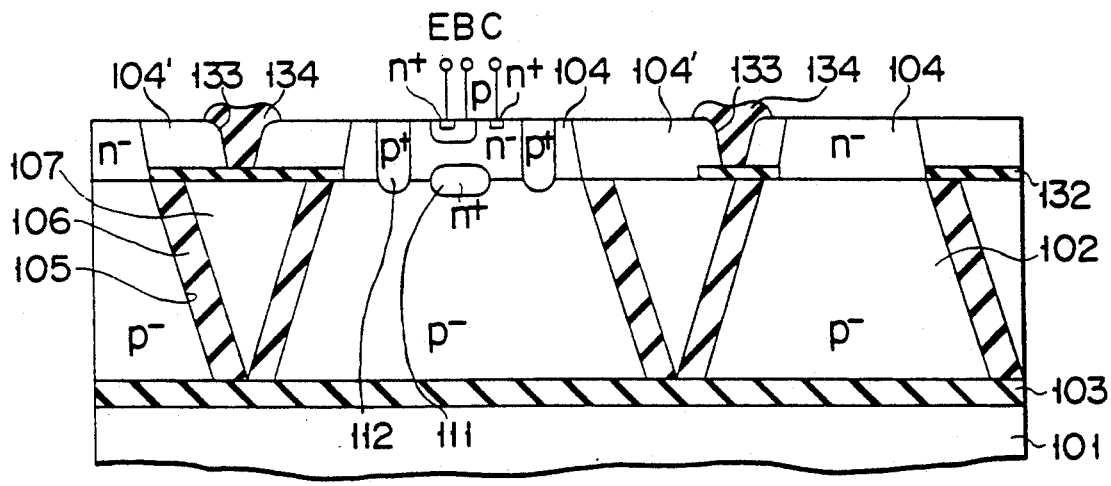
FIG. 9 is a cross-sectional view showing a structure of a dielectrically isolated semiconductor substrate according to a sixth embodiment of the invention.

FIG. 9 is a cross-sectional view schematically showing a structure of a semiconductor device according to a sixth embodiment of the invention. The reference numerals used in FIG. 7 denote the same elements, and detailed descriptions thereof are omitted. In the structure shown in FIG. 6, if the depth of the V-groove is large, the flattening by means of the organic insulating film is not easy. In the sixth embodiment, prior to forming the n⁻ epitaxial layer 104, the V-groove and oxide film are formed in the p⁻ layer 102 and polycrystalline Si is embedded in the layer 102. The V-groove is covered with oxide layer 132. Thereafter, as in the third embodiment, the n⁻ epitaxial layer 104 is formed, and devices are formed in the epitaxial layer 104.

When the n⁻ epitaxial layer 104 is formed, a polycrystalline silicon layer 104' grows on the V-groove 105. A groove 133 is formed in the polycrystalline silicon layer 104', and a polyimide 134 is embedded in the groove 133, and the upper part of the groove 133 is flattened. Then, contact holes are formed and metal wiring is conducted. In this structure, the depth of the groove 133, which is flattened by the polyimide 134 corresponds to the thickness of the n⁻ epitaxial layer 104. Thus, the groove 133 can be easily flattened. In FIG. 9, reference numeral 132 denotes an insulating layer.

Figure 10A:
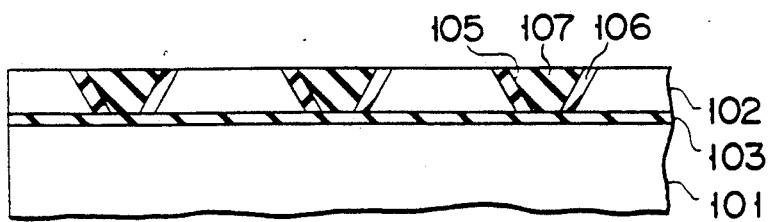

FIGS. 10A to 10E are cross-sectional views illustrating the process of manufacturing the dielectrically isolated substrate used for forming the devices shown in FIG. 9. As shown in FIG. 10A, two silicon wafers 101 and 102 are bonded to each other with an oxide film 103 interposed therebetween. The thickness of the upper silicon wafer 102 is reduced to a predetermined value, thus forming a p⁻ layer 102. Device-isolation V-grooves 105 are formed in portions of the layer 102, and oxide films 106 are formed on side surfaces of the grooves. Further, polycrystalline silicon films 107 are embedded in the grooves.

Figure 10B:
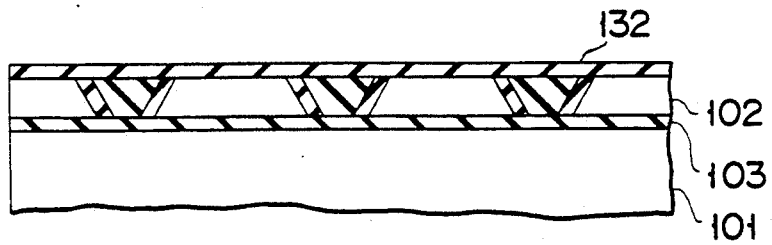
Figure 10C:
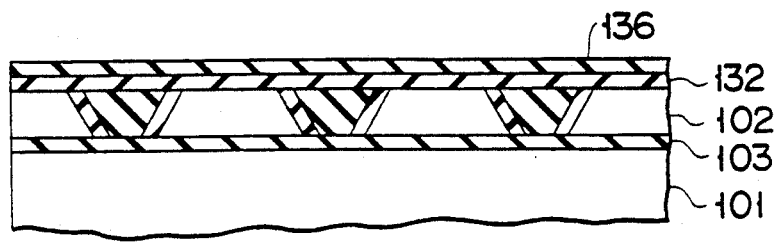

Subsequently, as shown in FIG. 10B, an oxide film 132 is formed over the surface of the resultant structure. Also, as shown in FIG. 10C, a thin polycrystalline silicon layer 136 is formed over the oxide film 132 by means of a LPCVD method. In the step shown in FIG. 10D, the polycrystalline silicon layer 136 and the oxide film 132 are patterned so that only those portions thereof, which overlie the V-grooves 105, may remain.

Then, a silicon layer is grown. Thus, as shown in FIG. 10E, a single crystal silicon layer is epitaxially grown on the layer 102, and a polycrystalline silicon layer is grown on the polycrystalline silicon layer 136. Since the polycrystalline silicon layers 136 are formed on the grooves, the growth rate of the portions on the thin polycrystalline layer 132 and that of the episilicon of the other portions become substantially equal. Thus, the thin silicon layers are excellently grown. The polycrystalline silicon layers formed on the grooves may be replaced with amorphous silicon layers. In this case, an amorphous silicon layer can be grown by a silane glow discharge with use of, for example, a plasma CVD apparatus.

Figure 11D:
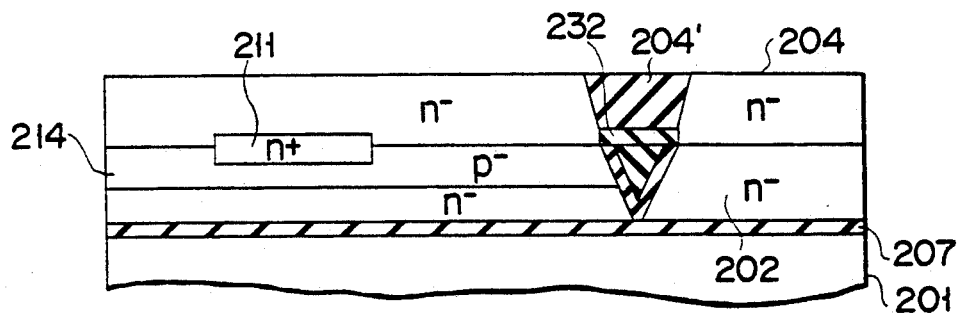
Figure 11E:
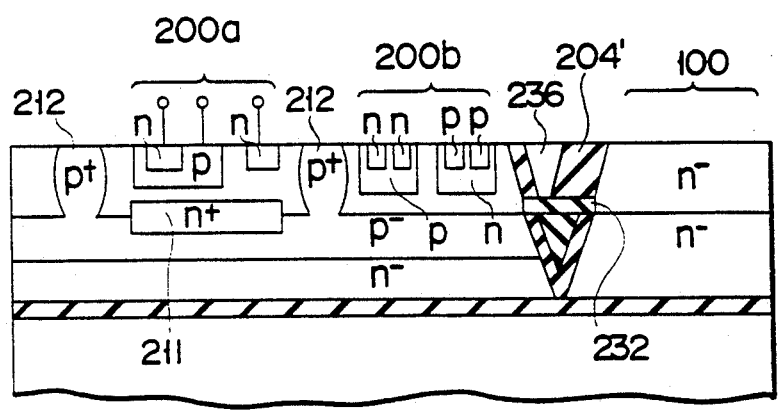

FIGS. 11A to 11E are cross-sectional views illustrating the process of manufacturing a semiconductor device according to a seventh embodiment of the invention. First, as shown in FIG. 11A, silicon wafers 201 and 202 are bonded to each other with an oxide film 203 interposed therebetween. The thickness of the upper silicon wafer 202 is reduced to a predetermined value to form an n⁻ layer 202. Then, as shown in FIG. 11B, a p⁻ layer 214 is formed in a portion of the layer 202. In the step shown in FIG. 11C, a V-groove 205 is formed, and an oxide film 206 is formed on the side faces of the V-groove 205. Then, a polycrystalline silicon film 207 is embedded in the groove 205.

In the step illustrated in FIG. 11D, an oxide film 232 is formed on the polycrystalline silicon film 207, and an n+ layer 211 is formed in a surface portion of the p⁻ layer 214. Subsequently, a silicon layer is grown on the resultant structure by means of a CVD method. In this case, a single crystal silicon layer 204 is epitaxially grown on the single crystal, and a polycrystalline silicon layer 204' is grown on the oxide film. Then, a groove is formed in the polycrystalline silicon layer 204' on the V-groove. The groove is filled with an organic insulating film 236 such as polyimide. Further, p+ layers 212 for isolation of devices are formed in the n⁻ epitaxial layer 204, and desired devices such as an npn transistor 200a and a CMOS 200b are formed in regions isolated by the p+ layers 212. For example, an output device 100 is formed in a region isolated from the devices by means of the V-groove.

Figure 12:
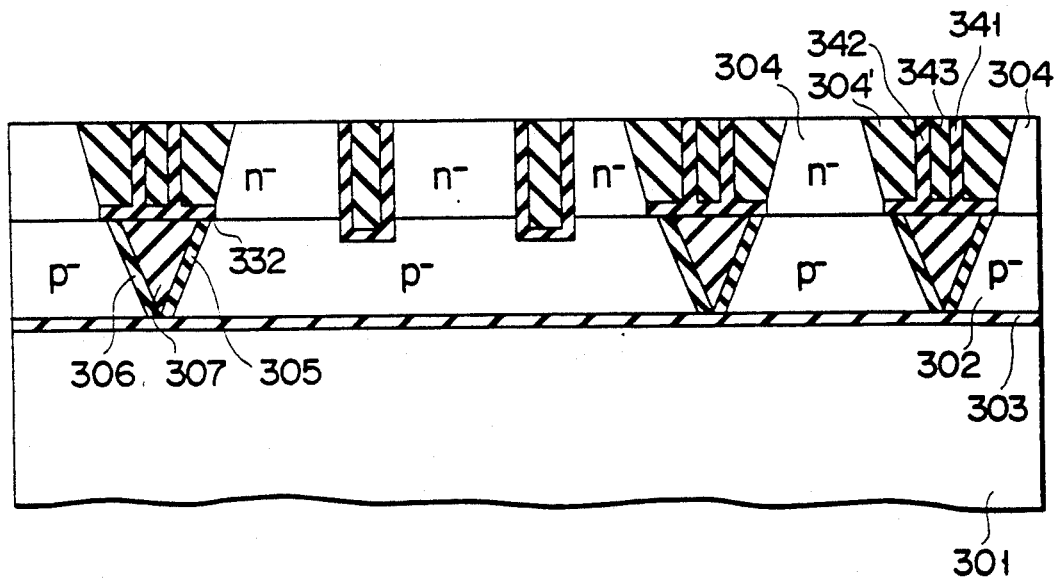
FIG. 12 is a cross-sectional view showing a structure of a dielectrically isolated semiconductor substrate according to an eighth embodiment of the invention.

FIG. 12 is a cross-sectional view schematically showing a structure of a dielectrically isolated substrate according to an eighth embodiment of the invention. Reference numeral 301 denotes a first silicon wafer serving as a support. A second silicon wafer 302 serving as a p⁻ layer is bonded with the first silicon wafer 301 with an oxide film (insulating film) 303 interposed therebetween. As is well known, the first and second silicon wafers 301 and 302 are bonded to each other, after the surfaces thereof are polished and the oxide film 303 is formed on at least one of the polished surfaces. An n⁻ epitaxial layer 304 is grown on the p⁻ layer 302, and V-grooves 305 are formed in the p⁻ layer 302. Oxide films 306 are formed on the side surfaces of the V-grooves 305. The V-grooves 305 are filled with polycrystalline silicon films 307. Trench grooves 341 are formed in the n⁻ epitaxial layer 304. Oxide films 342 are formed on the side surfaces of the trench grooves 341, and the trench grooves 341 are filled with polycrystalline silicon films 343. Polycrystalline silicon films 304' are grown on the oxide films 332. Thus, a MOS device and a bipolar device are formed in the n⁻epitaxial layer 304.

Figure 13A:
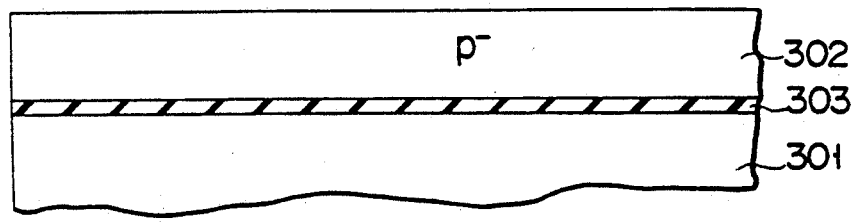
FIGS. 13A to 13J are cross-sectional views illustrating the steps of manufacturing the dielectrically isolated semiconductor substrate shown in FIG. 12.
Figure 13B:
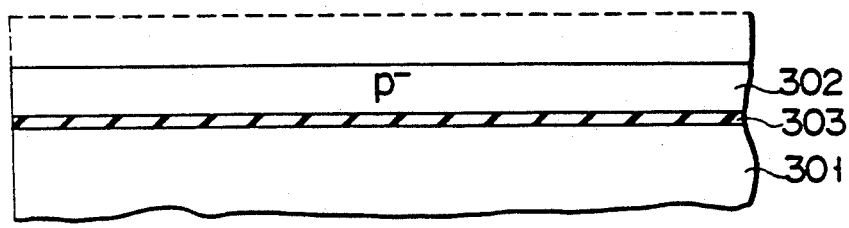

FIGS. 13A to 13J are cross-sectional views illustrating the process of manufacturing the dielectrically isolated substrate shown in FIG. 12. First, as shown in FIG. 13A, silicon wafers 301 and 302, each having at least one surface polished, are prepared. An oxide film 303 is formed on at least one of the wafers. Subsequently, as shown in FIG. 13B, the wafers 301 and 302 are bonded directly to each other as one body. The thickness of the upper silicon wafer 302 or the layer is reduced to a predetermined value. The thinned layer 302 is isolated from the wafer 391 or the support in the vertical direction by means of the oxide film 303.

Figure 13C:
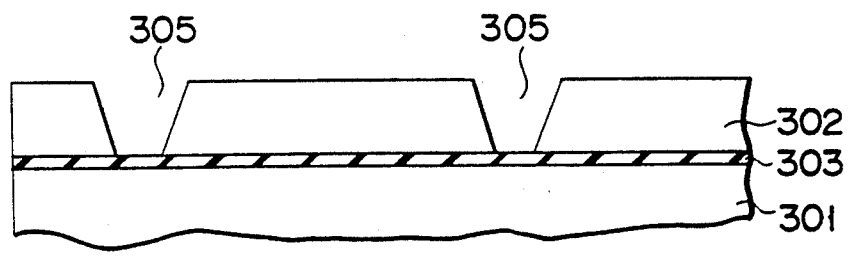
Figure 13D:
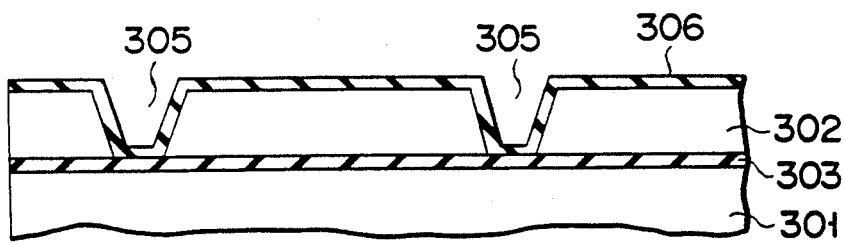
Figure 13E:
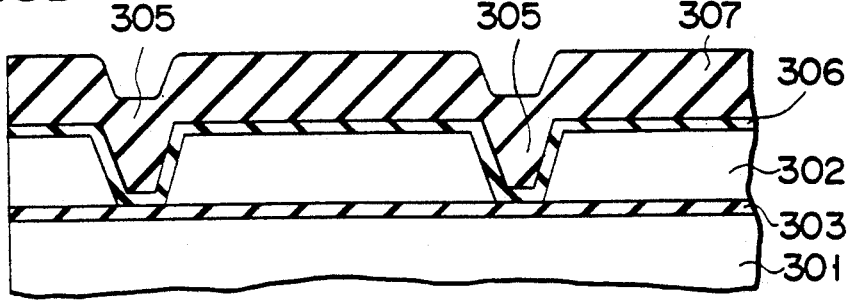
Figure 13F:
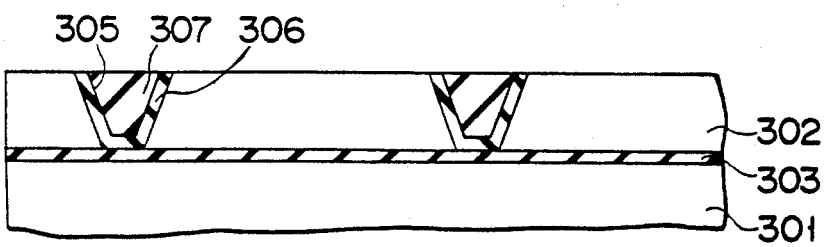

In the step shown in FIG. 13C, V-grooves 305 are formed so as to reach the oxide film 303. As shown in FIG. 13D, an oxide film 306 is formed on the side faces of the V-grooves 305, thus isolating regions of the layer 302 in the lateral direction. Further, as shown in FIG. 13E, a polycrystalline silicon film 307 is formed on the surface of the resultant structure, and the surface of the silicon film 307 is flattened by means of etch-back, etc. Thus, the V-grooves 305 are filled with the polycrystalline silicon film 307.

Figure 13G:
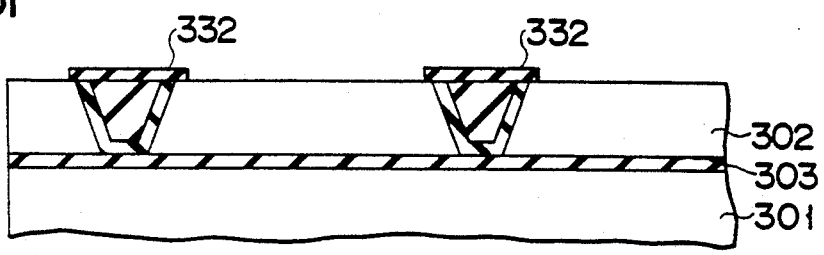
Figure 13H:
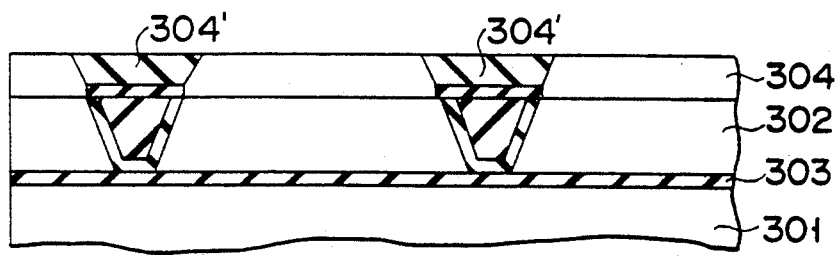
Figure 13I:
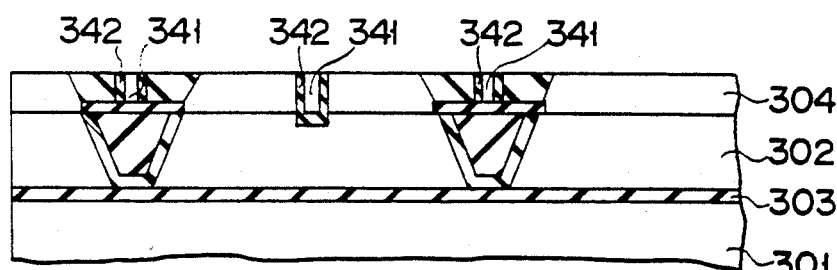
Figure 13J:
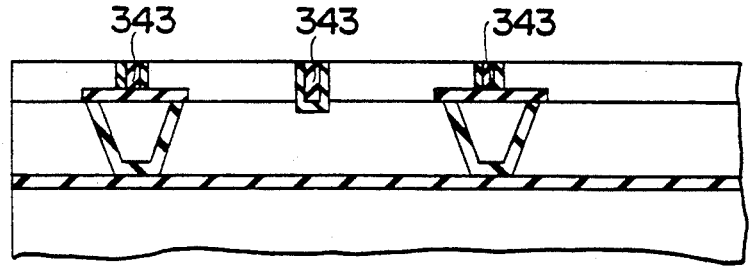

In the step illustrated in FIG. 13G, oxide films 332 are formed on the polycrystalline silicon film 307. In FIG. 13H, n⁻ epitaxial layers 304 are grown on the layer 302. In this case, polycrystalline silicon layers 304' are formed on the oxide films 332. In the step illustrated in FIG. 13I, trench grooves 341 are formed from the surface region of the resultant structure, and oxide films 342 are formed on the side faces of the trench grooves 341, thereby isolating the epitaxial layer 304 and the polycrystalline silicon layer 304' in the horizontal direction. Then, as shown in FIG. 13J, the trench grooves 341 are filled with polycrystalline silicon films 343, and the surface of the resultant body is flattened. Thus, the dielectrically isolated substrate shown in FIG. 12 is obtained.

In this structure, devices are not always isolated by means of dielectric isolation. Logic devices may be isolated in the horizontal direction by means of dielectric isolation, and may be isolated in the vertical direction by means of conventional pn junctions. In this case, the density of logic devices can be increased, compared to the case where a large number of V-grooves, each with a large width, are used. In addition, a high breakdown voltage MOSFET can be formed in the same island region as a logic device, and the source potential can be set to a value different from the substrate potential of the island region. Since dielectric isolation by means of the V-grooves is employed mainly for isolating a high breakdown voltage device from a logic device, the area occupied by the V-grooves can be reduced.

FIG. 14 is a cross-sectional view schematically showing a structure of a dielectrically isolated substrate according to a ninth embodiment of the invention. The reference numerals used in FIG. 12 denote the same elements, and detailed descriptions thereof may be omitted.

The ninth embodiment differs from the eighth embodiment, in that the oxide films 332 are not provided. If the oxide films 342 formed on the side faces of the trench grooves 341 are contiguous to the oxide films 306 formed on the side faces of the V-grooves 305, lateral isolation can be attained, and the dielectrically isolated substrate is obtained.

FIG. 15 is a cross-sectional view schematically showing a structure of a dielectrically isolated substrate according to a tenth embodiment of the invention. The reference numerals used in FIG. 12 denote the same elements, and detailed descriptions thereof are omitted.

The tenth embodiment differs from the eighth embodiment, in that V-grooves 351 are used to divide the epitaxial layer 304 into island regions. In other words, the V-grooves 351 are formed in portions of the epitaxial layer 304 and the polycrystalline silicon layer 304', oxide films 352 are formed on the side faces of the V-grooves 351, and polycrystalline silicon films 352 are embedded in the V-grooves 351. In this embodiment, the isolation area in the epitaxial layer 304 increases, but the thickness of the epitaxial layer 304 is several μm. Thus, this isolation can be carried out substantially identically with the trench isolation. The process for isolation is easier than that for trench isolation.

FIG. 16 is a cross-sectional view schematically showing a structure of a semiconductor device according to an eleventh embodiment of the invention. In this embodiment, the dielectrically isolated substrate shown in FIG. 12 is used. An IGBT (Insulated Gate Bipolar Transistor) device 61 serving as a high breakdown voltage device, a bipolar device 62 serving as a low breakdown voltage device, and a CMOS device 63 are formed in the same island region. More specifically, the npn bipolar device 62 and the CMOS device 63 are formed in the n⁻ epitaxial layer 304. The bipolar device 62 and the CMOS device 63 are isolated by means of a trench groove 341. Further, the low breakdown voltage device 62 and the high breakdown voltage IGBT device 61 are isolated by both V-groove 305 and trench groove 341.

With the above structure, the high breakdown voltage IGBT device 61 is formed in a double-layer structure of the p⁻ layer 302 and the n⁻ epitaxial layer 304. Since the lower p⁻ layer 302 is relatively thick, the breakdown voltage of the IGBT element 61 can be increased. In addition, since the bipolar device 62 can be considered to be equivalent to a device formed in a thin layer, by virtue of an n⁺ embedded layer 311 provided between the p⁻ layer 302 and the n⁻ epitaxial layer 304, the operation speed of the bipolar device 62 can be increased.

FIG. 17 is a cross-sectional view schematically showing a structure of a semiconductor device according to a twelfth embodiment of the invention. In this embodiment, only low breakdown voltage devices are shown. An n⁻ epitaxial layer 304 is isolated by means of trench grooves 341. An npn transistor is formed in the isolated region 71, a pnp transistor is formed in the region 72, a vertical pnp transistor is formed in the region 73, and a CMOS device is formed in the region 74.

In this twelfth embodiment, low breakdown voltage devices can be isolated by means of trench grooves. Though not shown in FIG. 17, there are further provided isolation regions from the high breakdown voltage device 61 as shown in FIG. 16. Though this embodiment is directed to the use of the substrate shown in FIG. 12, similar high and low breakdown voltage devices are formed in the substrate shown in FIG. 14 or FIG. 15.

FIG. 18 is a cross-sectional view schematically showing a structure of a semiconductor substrate according to a 13th embodiment of the invention. In this embodiment, an n-type epitaxial layer 404 is grown on a conventional-type dielectrically isolated wafer. This dielectrically isolated wafer is formed by forming V-grooves in a surface portion of a p⁻ substrate 402, forming oxide films 403 on the V-grooves, depositing a polycrystalline silicon film 401, and then polishing the bottom surface of the substrate 402 up to the grooves. The epitaxil layer 401 is formed on the polished side of he substrate 402.

Also in this embodiment, dielectric isolation is effected by forming trench grooves 441 in a polycrystalline silicon layer 404' grown on SiO₂ films 432 of isolation regions, and then forming oxide films 442 and polycrystalline silicon films 443 in the trench grooves 441. Also, the grooves may be filled with polyimide. Upward curvature of a conventional dielectrically isolated wafer can be reduced by suitably selecting conditions of growth of an epitaxial layer overlying the wafer. Further, when an IC is formed by integrating power devices, if a heavy metal is ion-implanted with a resist used as a mask, the life of carriers of only a given island can be decreased. This technique is advantageous in achieving the high-speed operation of a diode formed in other island region.

FIG. 19 is a cross-sectional view schematically showing a structure of a semiconductor device according to a 14th embodiment of the invention. This 14th embodiment is similar to the 13th embodiment shown in FIG. 18, excepting that the n$^-$ epitaxial layers of the dielectrically isolated substrate shown in FIG. 18 are isolated by trenches. More specifically, trenches are formed in the polycrystalline silicon layer 404' grown on the SiO$_2$ films 432 of isolation regions and the regions of the trenches are oxidized, whereby dielectric isolation is attained. Simultaneously, trenches are formed in the epitaxial layer 404 grown on the surface of the p$^-$ substrate 402 and the regions of the trenches are oxidized, whereby dielectric isolation is attained.

FIG. 20 is a cross-sectional view schematically showing a structure of a semiconductor device according to a 15th embodiment of the invention. In this embodiment, dielectric isolation is attained by means of trenches. More specifically, an n$^+$ embedded layer 511 is formed in surface portions of a p$^-$ layer 502'. After an n$^-$ epitaxial layer 504 is formed, trenches 505 are formed by means of RIE (Reactive Ion Etching) or the like. The trenches formed by RIE allow easy filling of thermal oxide films 506 and polycrystalline silicon films 507 and flattening by means of etch-back technique. The thickness of the n$^-$ epitaxial layer 504 can be kept constant before and after the flattening step. Also, the use of the embedded n$^+$ layer 511 can reduce the thickness of the n$^-$ epitaxial layer 504 in the region of logic devices. Thus, the performance of the logic devices can be enhanced. On the other hand, since a depletion layer can be widened into the n$^-$ epitaxial layer 504 and the p$^-$ layer 502 in a region of a high breakdown voltage device, a high breakdown voltage can be obtained. In the 15th embodiment, an n$^+$ layer may be formed in the trench by diffusion after the trench has been formed. Also, an n$^-$ layer may be used as the layer 502. The epitaxial layer 504 and buried layer may be of p-type.

FIGS. 21A to 21E are cross-sectional views illustrating the process of manufacturing a dielectrically isolated substrate according to a 16th embodiment of the invention. In this 16th embodiment, a high-concentration impurity layer is formed on the second silicon wafer side, thus reducing the degree of curvature of the dielectrically isolated substrate.

As shown in FIGS. 21A, Si substrates 501 and 502 are prepared, and at least one of the substrates is oxidized to form an oxide film 503. In FIG. 21A, the substrate 502 is oxidized. As shown in FIG. 21B, after the substrates 501 and 502 are bonded to each other, the substrate or layer 502 is polished to a predetermined thickness. In the step shown in FIG. 21C, a high-concentration impurity layer 511 is formed over the polished substrate 502 by means of a conventional diffusion technique. An Si layer 504 is epitaxially grown on the high-concentration impurity layer 511.

In the subsequent step shown in FIG. 21D, grooves 505 reaching the oxide film 503 are formed from the surface of the resultant structure, thereby isolating the layer 502 and the epitaxial layer 504 in an insular form. Then, as shown in FIG. 21E, oxide films 506 are formed on the side faces of the grooves 505 to electrically isolate the formed island regions. Finally, the grooves 505 are filled with a polycrystalline silicon film 507 or the like and, if necessary, the surface of the resultant structure is flattened, thus obtaining a dielectrically isolated substrate. In the figure, the groove 505 is shown as a trench formed by means of RIE, but it may be a V-groove or a U-groove formed by means of wet etching, etc.

With the above structure, by virtue of the high-concentration impurity layer 511, the curvature of the dielectrically isolated substrate, which occurs when the temperature for thermal treatment falls to room temperature, can be reduced. The reason for this will now be explained.

In general, when a high-concentration impurity layer is provided on the surface of an Si wafer, a warp appears on the wafer. This is because the covalent radius of Si atoms differs from that of impurity atoms. For example, when typical p-type and n-type impurities of boron and phosphorus are used, a surface portion of the wafer, which is diffused with these, curves concave.

When two wafers are bonded to each other through thermal treatment and the temperature for thermal treatment falls to room temperature, a stress occurs in the silicon layer and oxide layer owing to a difference in thermal contraction. Since the thermal contraction of the silicon layer is greater than that of the oxide film, a tensile stress acts in the silicon layer at room temperature so that the silicon layer tends to contract. On the other hand, a compressive stress acts in the oxide film so that oxide film tends to expand. Since the upper wafer of the bonded substrate has been thinned by polishing, the oxide film is located above with respect to the center of the substrate. Thus, the substrate warps toward the upper wafer or the second wafer.

If a high-concentration impurity layer is provided over the upper wafer of the substrate, a warp is cancelled and reduced. However, the high-concentration impurity layer on the surface of the upper layer prevents the formation of devices in the substrate.

In the present embodiment, the high-concentration impurity layer is provided within the upper wafer. Thus, desired devices can be formed in the Si layer overlying the impurity layer, while the warp is cancelled. The location where the high-concentration impurity layer is formed is not limited to the inside of the layer. The high-concentration impurity layer may be formed in a bottom portion of the layer. The thickness of the Si layer on the impurity layer, i.e. the depth of the impurity layer, can be freely chosen. In general, this thickness is determined, depending on the characteristics required in devices to be formed in the Si layer on the impurity layer.

FIG. 22 is a cross-sectional view schematically showing a structure of a semiconductor device according to a 17th embodiment of the invention. In FIG. 22, reference numeral 601 denotes a first silicon wafer, 602 a second silicon wafer, 603 an oxide film, 611 a high-concentration impurity layer, 604 an epitaxially grown Si layer, 605 a trench groove, 606 a side-wall oxide film, and 617 an embedded polycrystalline silicon.

Portions of the layer 602 and the high-concentration impurity layer 611 are removed. In obtaining the substrate shown in FIG. 22, selective diffusion by a conventional method is carried out in the step of forming the high-concentration impurity layer 611. In the figure, showing an example wherein this substrate is actually applied, a high breakdown voltage device requiring a thick Si layer is formed in the region where the high-concentration impurity layer 611 is not provided, and a low breakdown voltage device is formed in the region where the high-concentration impurity layer 611 is provided. In the figure, all layers are of n-type; however, these may be of p-type. The type and impurity concentration may differ between layers sandwiching the high-concentration impurity layer 611. The high-concentration impurity layer formed on the side walls of the groove 605 is necessary, from the viewpoint of characteristics of devices. The provision of this high-concentration impurity layer does not affect the present invention. An embedded high-concentration layer may be provided for improving characteristics of devices or for isolation of devices. The high-concentration impurity layer of the present invention can also serve as this high-concentration layer. In FIG. 2, this is exemplified by the high-concentration impurity layer 611 provided under the low breakdown voltage device.

Figure 23C:
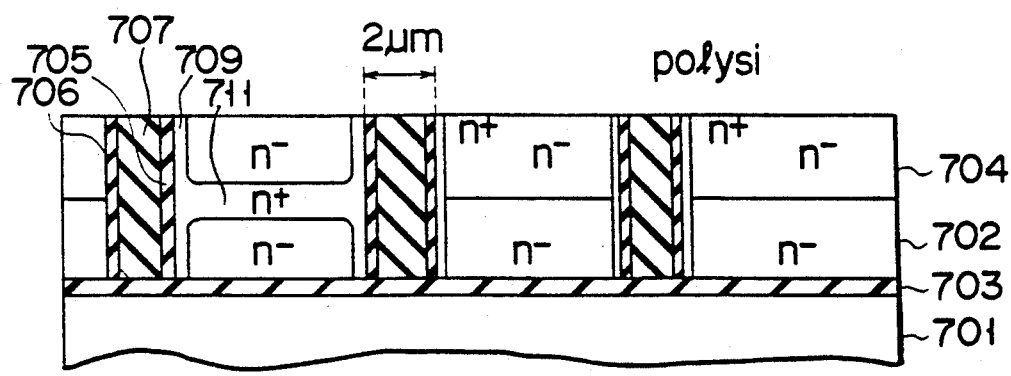

FIGS. 23A to 23D are cross-sectional views illustrating the process of manufacturing a semiconductor element according to an 18th embodiment of the invention. In this embodiment, devices are isolated by trenches. As shown in FIG. 23A, silicon wafers 701 and 702 are bonded to each other with an oxide film 703 interposed therebetween. The thickness of the upper silicon wafer 702 is reduced to a predetermined value, thus forming an n− active layer 702. Then, as shown in FIG. 23B, an n+ layer 711 is formed in a portion of the layer 712, and an n− epitaxial layer 704 is grown. In the step shown in FIG. 23C, trench grooves 705 are formed, and oxide films 706 are formed on the side faces of the trench grooves 705. The grooves 705 are filled with a polycrystalline silicon film 707. Impurities are diffused in the side faces of the grooves, thereby forming an n+ layer 709.

Figure 23D:
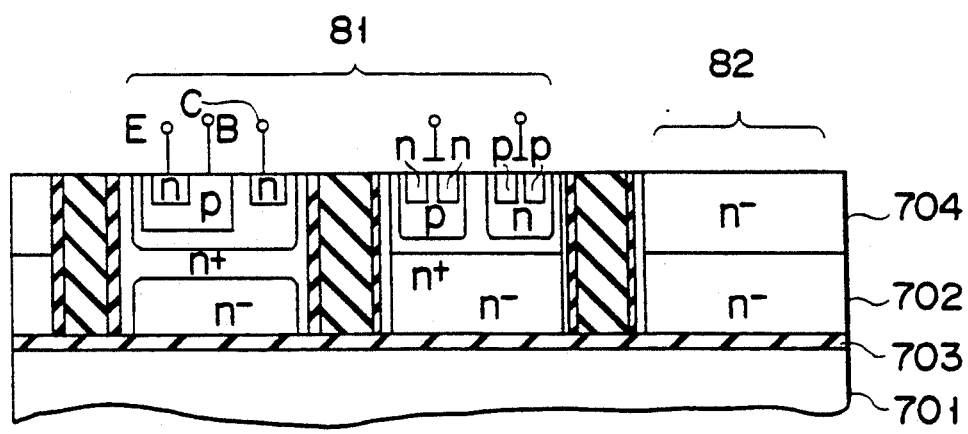

In the following step shown in FIG. 23D, a bipolar device and a MOS device are formed in isolated regions of the n− epitaxial layer 704. In the figure, reference numeral 81 denotes a region where a low breakdown voltage device is formed, and numeral 82 denotes a region where a high breakdown voltage device is formed.

Figure 24:
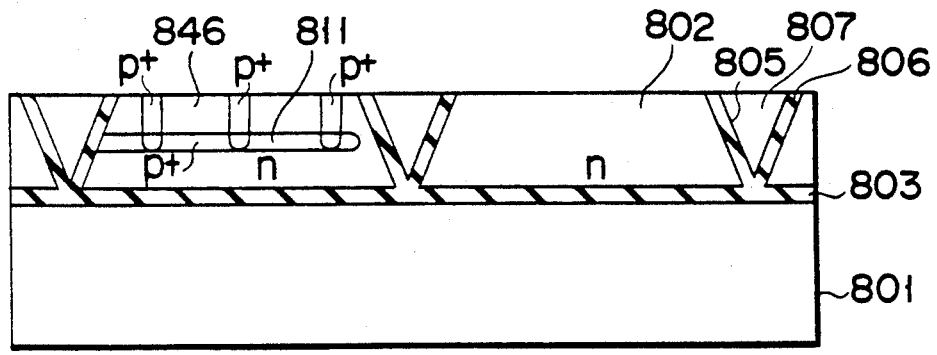
FIG. 24 is a cross-sectional view showing a structure of a dielectrically isolated semiconductor substrate according to a 19th embodiment of the invention.

FIG. 24 is a cross-sectional view schematically showing a structure of a semiconductor device according to a 19th embodiment of the invention. The 19th embodiment is a modification of the embodiment shown in FIG. 22. In FIG. 24, reference numeral 801 denotes a first wafer, 802 a second silicon wafer, 803 an oxide film, 811 a high-concentration impurity layer, 846 an epitaxially grown silicon layer, 805 an isolation groove, 806 a side-wall oxide film, and 807 an embedded polycrystalline silicon layer. The isolation groove 805 is a V-groove formed by means of wet etching. A junction-isolated low breakdown voltage device is formed in an upper region of the epitaxial layer, and a high breakdown voltage device is formed in a region where the epitaxial layer is not provided. In order to form the substrate according to this embodiment, selective diffusion is carried out in a given surface portion of the dielectrically isolated substrate, and an epitaxial layer is grown on the diffused region.

The present invention is not limited to the above embodiments. For example, the conductivity types of the second silicon wafer and the epitaxial layer are not necessarily opposite to each other, and these may be the same. When the high breakdown voltage device and the low breakdown voltage device are isolated by means of a pn junction, the conductivity types of the second silicon wafer and the epitaxial layer need to be opposite to each other; however, when these devices are isolated dielectrically, the conductivity types of the second silicon wafer and the epitaxial layer may be the same. Various devices, as well as MOS devices and bipolar devices, may be used for the high breakdown voltage devices and the low breakdown voltage devices. Other modifications may be made within the scope of the subject matter of the present invention.

As has been described above in detail, the present invention can provide a dielectrically isolated substrate suitable for formation of high breakdown voltage and low breakdown voltage devices, and the characteristics of semiconductor devices formed on the substrate can be improved.

According to the present invention, the substrate is formed of two layers. When a bipolar device is formed, a high-concentration impurity layer is interposed between these two layers, thereby isolating the device (pn-junction isolation). Thus, the number of grooves that occupy a relatively large area can be reduced, and accordingly the area for the formation of devices can be increased.

Also, according to the present invention, the thickness of the substrate can be increased in a region where a high breakdown voltage device (e.g. DMOS device) is formed, and can be decreased in a region where a low breakdown voltage device (e.g. bipolar device) is formed. Thus, the optimal thickness of the substrate both for the high breakdown voltage device and the low breakdown voltage device can be set, and the characteristics of devices can be enhanced.

Furthermore, according to the present invention, grooves are formed after an epitaxial layer is grown, and the grooves are filled with an organic insulating film. Thus, when the surface of the substrate is flattened, the thickness of the epitaxially grown layer is not reduced; therefore, the epitaxially grown layer with a uniform thickness can be obtained.

Various modifications will be described below with reference to the accompanying drawings.

Figure 25:
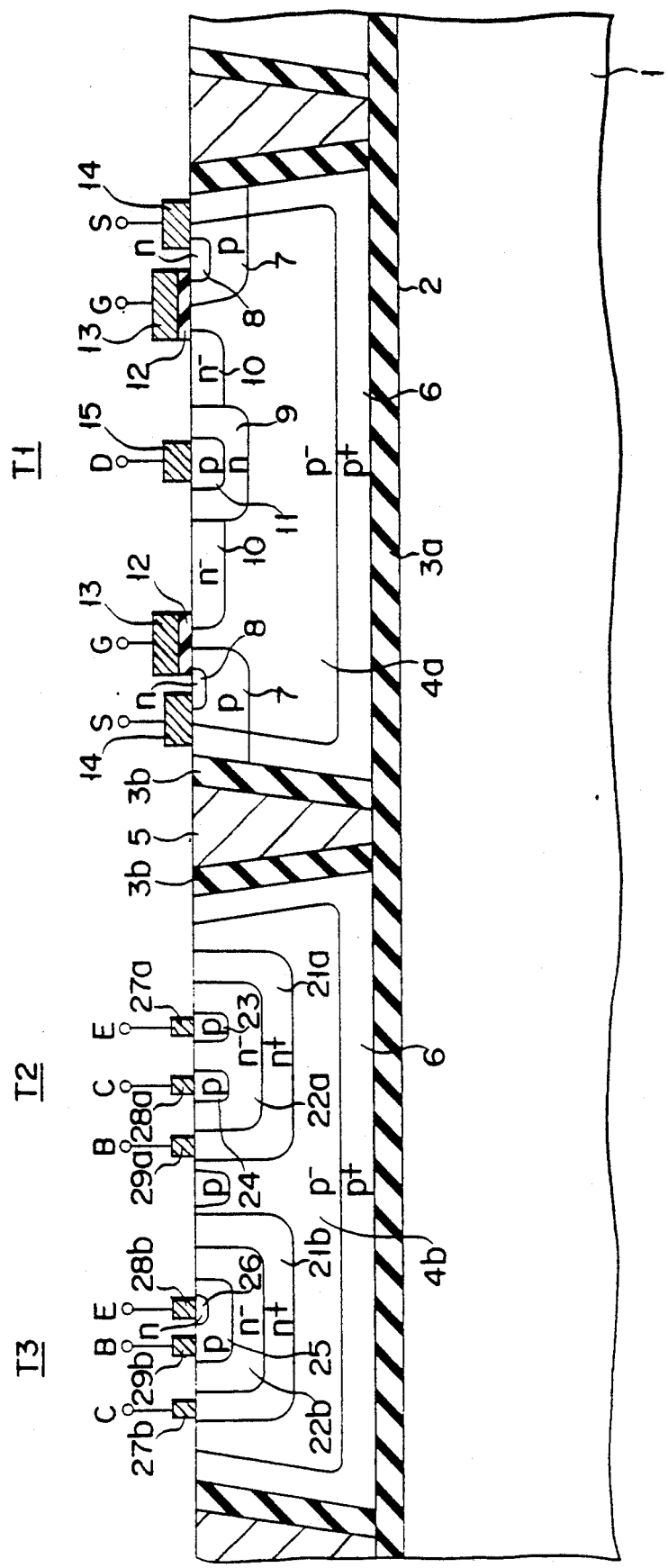
FIG. 25 is a sectional view of a semiconductor device according to one modification of the present invention.

FIG. 25 is a sectional view of a semiconductor device according to an embodiment of the present invention. In this semiconductor device, lateral insulated gate bipolar transistor (IGBT) T1 as a high breakdown voltage element, and a plurality of bipolar transistors (FIG. 1 shows two transistors, i.e., pnp and npn transistors T2 and T3) as a plurality of low breakdown voltage elements used for a control circuit of transistor T1 are integrally formed. More specifically, a plurality of p−-type Si layers 4a and 4b which are isolated from each other in island forms by $SiO_2$ layers 3a and 3b are formed in Si substrate 4 on Si substrate 1. IGBT T1 is formed in one Si layer, i.e. layer 4a, whereas pnp and npn transistors T2 and T3 which are isolated from each other by pn junction isolation are formed in the other Si layer, i.e., layer 4b. This process will be described in details in accordance with practical manufacturing steps.

Figure 26C:
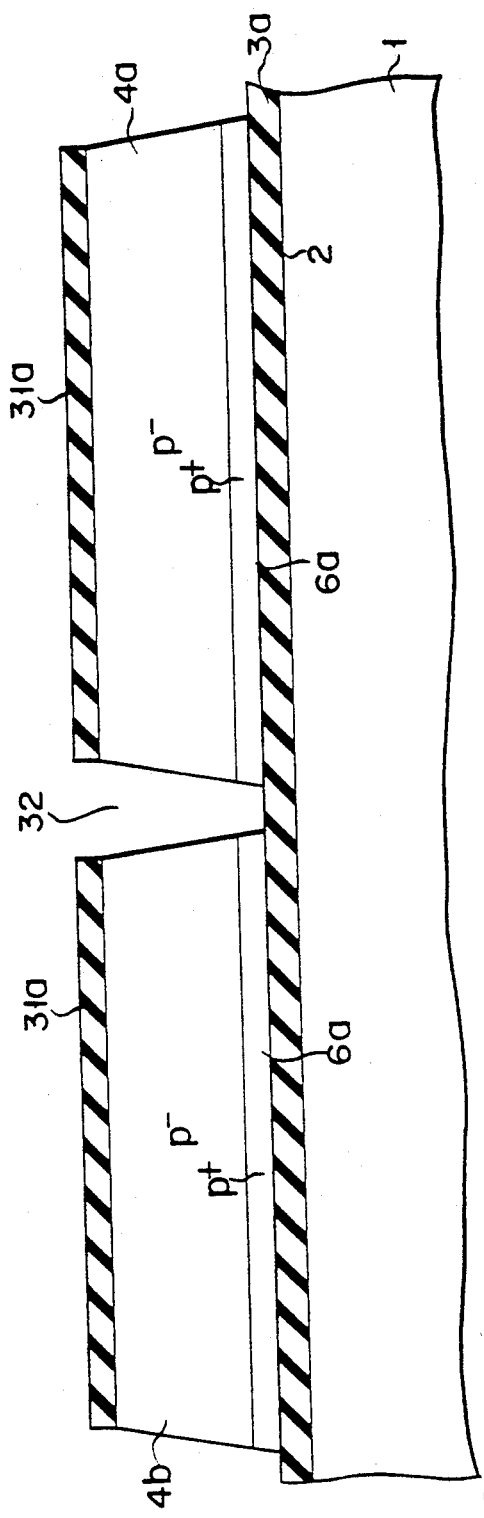

FIGS. 26A to 26G show the manufacturing steps. First, two Si substrates 1 and 4 are prepared. One surface of each of Si substrates is mirror-polished. One substrate, i.e., Si substrate (first semiconductor substrate) 4 is a p$^-$-type substrate for element formation, and has a resistivity of 70 to 100 Ω.cm. After p$^+$-type layer 6a is formed in the mirror-polished surface of substrate 4 by diffusing boron at a high concentration SiO$_2$ film 3a having a thickness of about 1 μm is formed on the surface of the resultant structure (FIG. 26A). The other substrate, i.e., Si substrate (second semiconductor substrate) 1 may be of p- or n-type, and has no limitation as to specific resistivity. Such two substrates 1 and 4 are bonded to each other by a silicon wafer direct-bonding technique. Then, a surface of substrate 4, which is opposite to the bonding surface, is polished to obtain p$^-$-type Si layer 4 having a thickness of about 60 μm (FIG. 26B). SiO$_2$film 3a is used for element isolation. It has been confirmed from experiments performed by the present inventors that in order to reduce warpage of the resultant wafer, SiO$_2$ film 3a must be formed on element formation substrate 4 in advance, and that bonding interface 2 must face the upper surface of SiO$_2$ film 3a which is formed on element formation substrate 4 in advance.

The steps of practical direct bonding are performed in the following manner. Substrates to be bonded are cleaned by an H$_2$SO$_4$-H$_2$O$_2$ mixture solution, HCl-H$_2$O$_2$ mixture solution, aqua regia, or the like. Subsequently, the substrates are cleaned by water for about ten minutes, and are dried by a spin dryer or the like. The substrates subjected to these processes are set in a clean atmosphere below, e.g., class 100, and their mirror-polished surfaces are bonded to each other in a state wherein substantially no contaminant is present therebetween. With this process, the two substrates are bonded to each other with a certain strength. When the substrates bonded to each other in this manner are subjected to heat-treatment in a diffusion furnace or the like, bonding strength is increased, and the two substrates are completely bonded. An increase in bonding strength is observed at about 200° C. or more, preferably at 800° to 1200° C. No special attention need be paid to the atmosphere for the heat-treatment process. For example, heat-treatment can be performed in an oxygen, nitrogen, hydrogen, inert gas, steam, or a gas mixture thereof. In the embodiment, cleaning was performed by an H$_2$SO$_4$-H$_2$O$_2$ mixture solution and an HCl-H$_2$O$_2$ mixture solution, and heat-treatment was performed a nitrogen atmosphere including a small amount of oxygen at 1,100° C. for two hours.

Figure 26D:
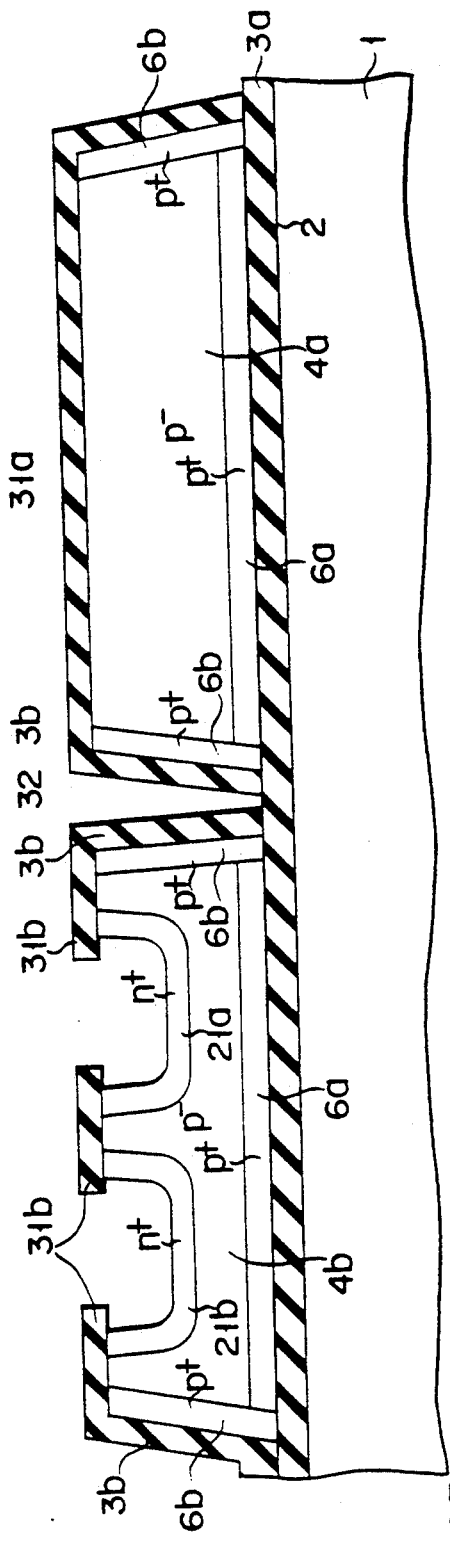

Subsequently, the surface of Si substrate 4 is lapped and polished to reduce the thickness. And, SiO$_2$ film 31 is formed on the upper surface of Si substrate 4. Tapered isolation trench 32 is then formed by etching, e.g., anisotropic etching Si layer 4 to a depth reaching SiO$_2$ film 3a using pattern 31a obtained by patterning SiO$_2$ film 31 as a mask. With this process, Si layers 4a and 4b are isolated in the forms of islands (FIG. 26C). Boron is diffused in isolation trench 32 by diffusion so as to form p$^+$-type layers 6b in the side walls of island Si layers 4a and 4b. p$^+$-type layers 6b are integrated with p$^+$-type layer 6a on the bottom of the isolation trench so as to constitute p$^+$-type layer 6. SiO$_2$ film 3b is formed in the side wall of each Si layer 4 by another thermal oxidation of the side wall. Then, SiO$_2$ film 31 on the surface of Si layer 4b on the low breakdown voltage element side is patterned to form pattern 31a. Si layer 4 is etched by using pattern 31a as an etching mask to form recesses in the element region. Phosphorus or antimony is introduced in the recesses at a high concentration by diffusion to form n$^+$-type layers 21a and 21b (FIG. 26D).

Figures 26E, 26F:
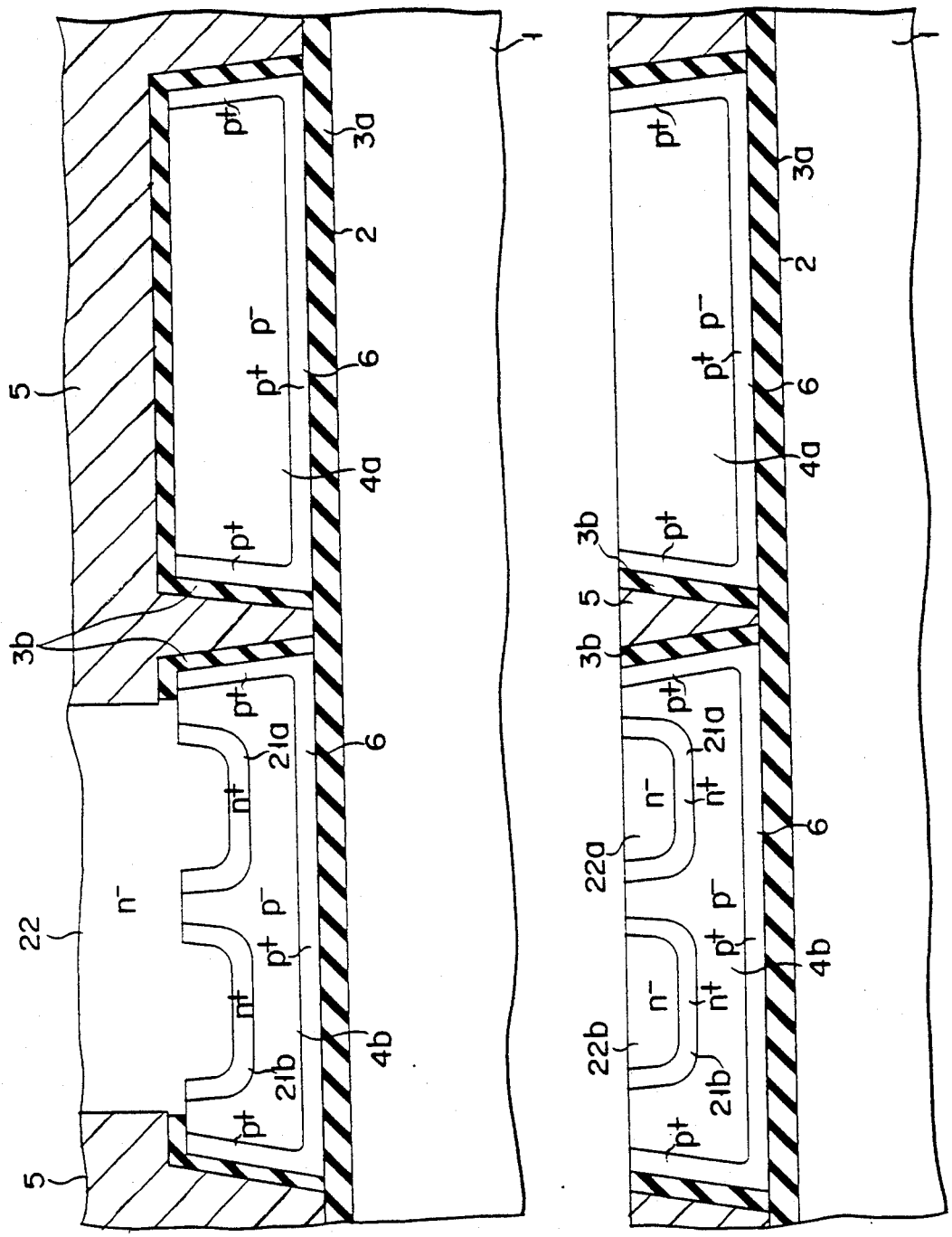

Subsequently, SiO$_2$ film 31b on the surface of Si layer 4b in which the recesses are formed is removed, and epitaxial growth of Si is performed to form high-resistance n$^-$-type layer 22. At the same time, polysilicon layer 5 is formed on SiO$_2$ film 31a on the isolation region covered with SiO$_2$ film 3b and on the other Si layer, i.e., layer 4a (FIG. 26E). In this case, there a thin polycrystalline silicon layer is formed on the oxide film 3b, a simultaneous growth of the epitaxial layer 22 and the polycrystalline silicons layer 22 can be formed more easily. The growth layer surface is then lapped and polished so that the thickness of substrate 4 is 20 to 100 μm, and n$^-$-type layers 22a and 22b are buried in the recesses to obtain a flat state wherein polysilicon film 5 is buried in the isolation trench (FIG. 26F). Since n$^-$-type layer 22 is buried only in the recesses and other portions thereof are removed, only portions of SiO$_2$ film 31b overhanging in the recesses need be theoretically removed when the epitaxial growth process in FIG. 26E is performed. However, if crystal growth is performed while SiO$_2$ film 31b is locally left, a high-quality single crystal cannot be buried, and hence defects are often caused. In order to decrease the defects, SiO$_2$ film 31b on the surface of Si layer 4b is preferably removed substantially entirely in crystal growth, as described above.

Pnp transistor T2 and npn transistor T3 which are isolated from each other by a pn junction isolation are respectively formed in n$^-$-type layers 22a and 22b buried in this manner.

More specifically, p-type layers 23 and 24 are formed in the surface region of n$^-$-type 22a at a predetermined interval. Thereafter, collector, emitter, and base electrodes 27a, 28a, and 29a are formed. As a result, lateral type pnp transistor T2 having n$^-$-type layer 22a serving as a base, and p-type layers 23 and 24 respectively serving as a collector and a emitter is formed.

p-type layer 25 is formed in the surface region of n-type layer 22b by impurity diffusion. In addition, n-type layer 26 is formed in the surface region of p-type layer 25. Then, collector, emitter, and base electrodes 27b, 28b, and 29b are formed to form vertical type npn transistor T3 having n$^-$-type layer 22b as a collector, p-type layer 26 as a base, and n-type layer 26 as an emitter.

Figure 26G:
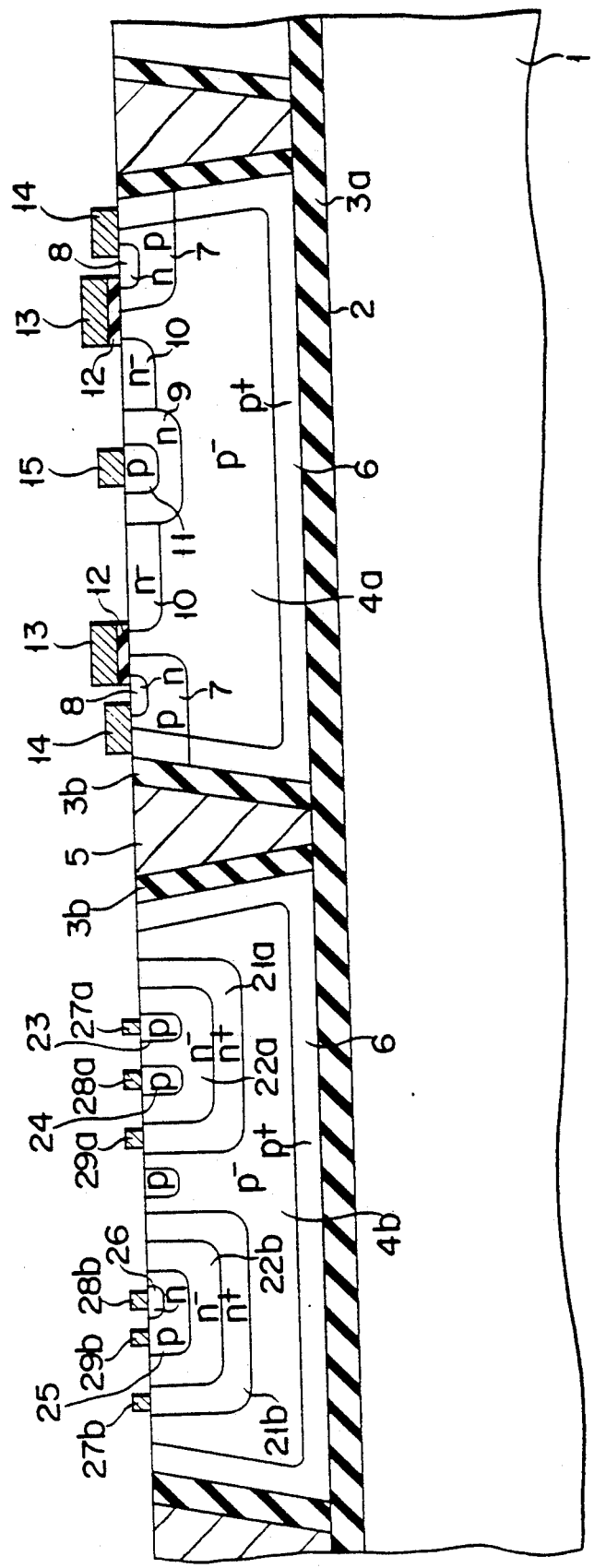

Subsequently, in p$^-$-type Si layer 4a, p-type base layer 7 is formed in its peripheral portion, n-type source layer 8 is formed therein, n-type base layer 9 is formed in its central portion, and p-type drain layer 11 is formed therein by impurity diffusion. N$^-$-type layer 10 serving as a guard ring is formed around n-type base layer 11 by impurity diffusion. Gate electrode 13 is formed on a region between n-type source layer 8 and n$^-$-type layer 10 with gate insulating film 12 interposed therebetween. Then, drain electrode 15 is formed on p-type drain layer 11, and source electrode 14 is formed on n-type source layer 8 and p-type base layer 7 so as to be simultaneously in contact with layers 8 and 7, thereby obtaining IGBT-T1 (FIG. 26G).

In the semiconductor device obtained in the above-described manner, high breakdown voltage IGBT-T1 processing a large current can be electrically isolated from low breakdown voltage transistors T2 and T3 operated by a small current with high reliability by a dielectric material. On the other hand, since transistors T2 and T3 are isolated from each other by a pn junction isolation, an extra area for element isolation is not required. Therefore, a high integration density can be realized. In the above embodiment, two bipolar transistors are integrated as low breakdown voltage elements. The present invention, however, exhibits a noticeable effect in terms of integration density especially when a large number of low breakdown voltage elements are integrated. Furthermore, in the above embodiment, high-concentration $p^+$-type layers 6 are formed on the oxide film interfaces of the bottom and side walls of the $p^-$-type layers isolated in the forms of islands, thereby obtaining high reliability. More specifically, many defects are normally present in an oxide film interface. If a depletion layer extending from an element formed in the device reaches this interface leak, a decrease in breakdown voltage, or the like may be caused. However, formation of $p^+$-type layers 6 can prevent the depletion layer from reaching the interface.

Note that in the above embodiment, only one IGBT serving as a high breakdown voltage element is exemplified. However, a plurality of such elements may be integrally formed. In this case, the high breakdown voltage elements preferably have a dielectric isolation structure.

The present invention is not limited to the above embodiment. Other embodiments will be described below. The same reference numerals in the drawings of the following embodiments denote the same parts as in the drawings of the previous embodiment, and a detailed description thereof will be omitted.

Figure 27:
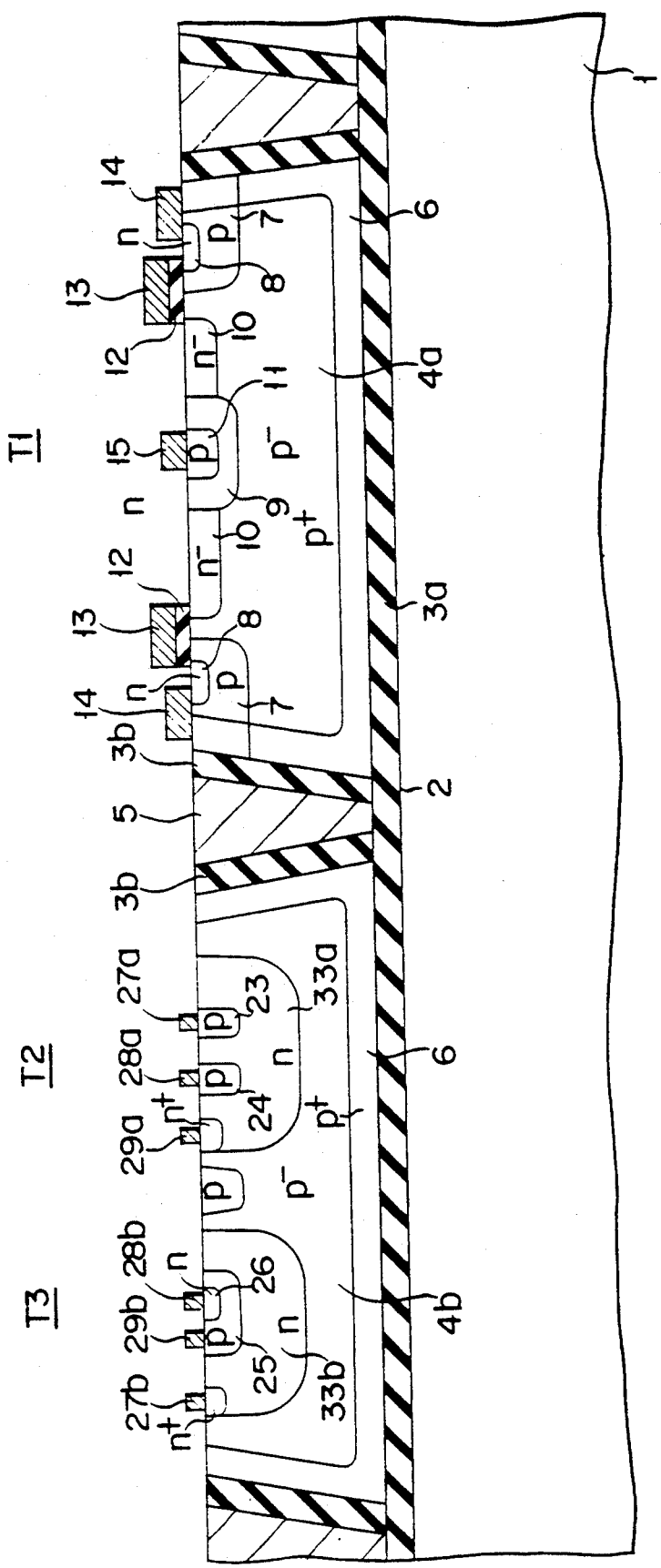
FIG. 27 is a sectional view of a semiconductor device in which a formation region of low breakdown voltage elements is formed by impurity diffusion.

FIG. 27 shows an embodiment wherein transistors T2 and T3 in FIG. 1 are modified. In this embodiment, n-type layers 33a and 33b respectively serving as a base layer and a collector layer of each of transistors T2 and T3 are formed by impurity diffusion.

According to this embodiment, since a low-resistance $n^+$-type buried layer such as shown in the previous embodiment is not formed, transistor characteristics are slightly inferior to those in the previous embodiment. However, since the steps of forming the recesses, crystal growth, etching, and the like upon formation of the dielectric isolation structure are omitted, the overall steps can be greatly simplified, thereby decreasing the manufacturing cost.

FIG. 28 shows an embodiment wherein lateral type MOSFET-T1 is used in place of IGBT-T1. In this embodiment n-type layer 9, is a drain layer, and drain electrode 15 is in direct contact therewith. Unlike IGBT-T1 in the embodiment of FIG. 1, MOSFET-T1 is not bipolar-operated but is unipolar-operated by ON-/OFF control of a channel formed on its surface. In this embodiment, even when a plurality of identical lateral type MOSFETs are integrally formed, no specific element isolation is required between them.

Figure 29A:
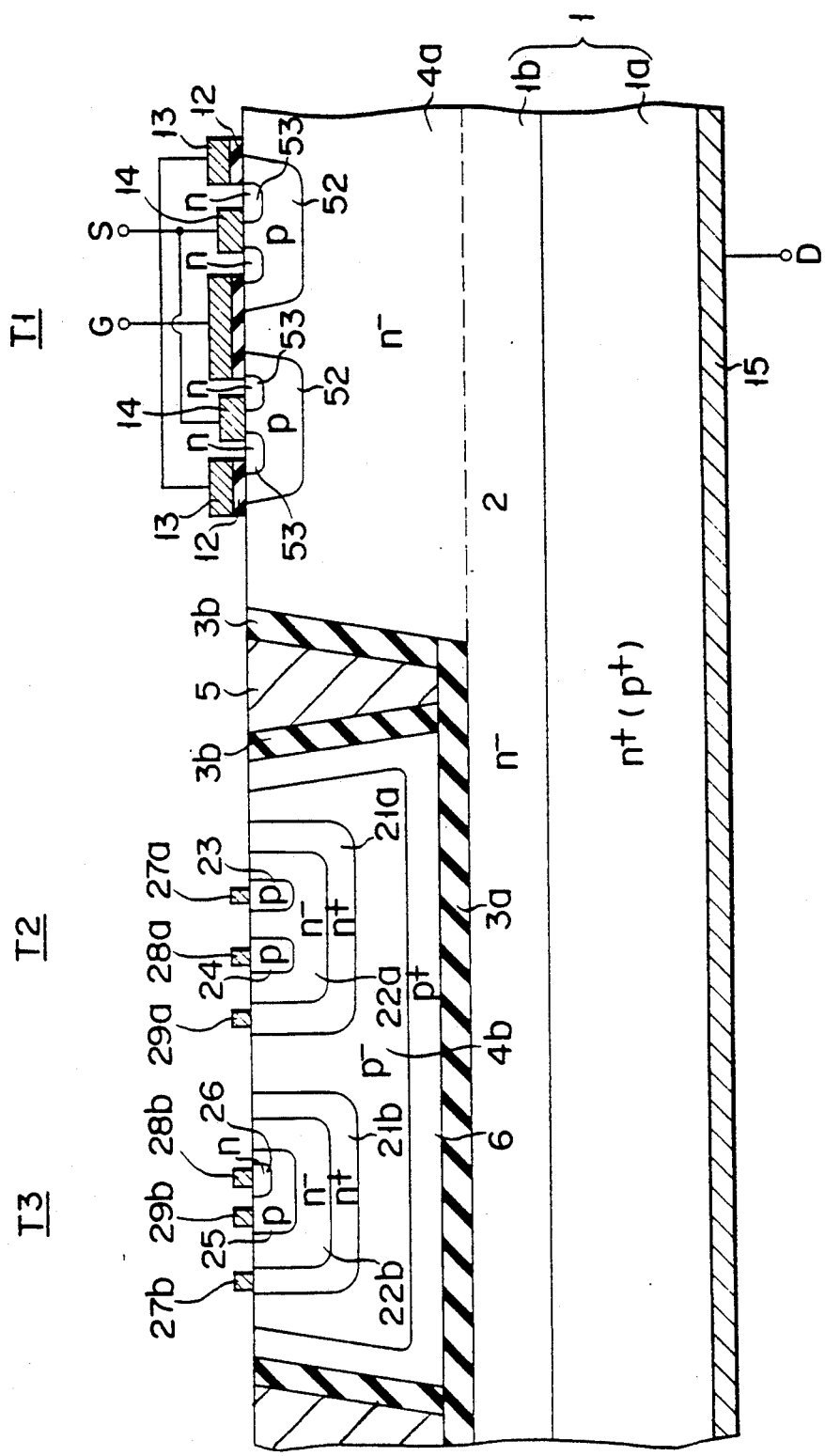
FIGS. 29A to 29C are sectional views of semiconductor devices in which a vertical type device is used as a high breakdown voltage element.

FIG. 29A shows an embodiment wherein vertical type MOSFET-T1 is used in place of IGBT-T1 in FIG. 25. In this case, substrate 1 has a double-layer structure consisting of $n^+$- and $n^-$-type layers 1a and 1b, and no $SiO_2$ film is formed on bonding interface 2 in the region of MOSFET-T1. P-type base layer 52 is formed in a surface portion of $n^-$-type layer 41a, n-type source layer 53 is formed therein, and $n^+$-type layer 1a is formed as a drain, thereby forming vertical type MOSFET-T1.

In FIG. 29A, $n^+$-type layer 1a can be replaced with $p^+$-type layer. In this case, element T1 may be a thyristor or IGBT.

Figure 29B:
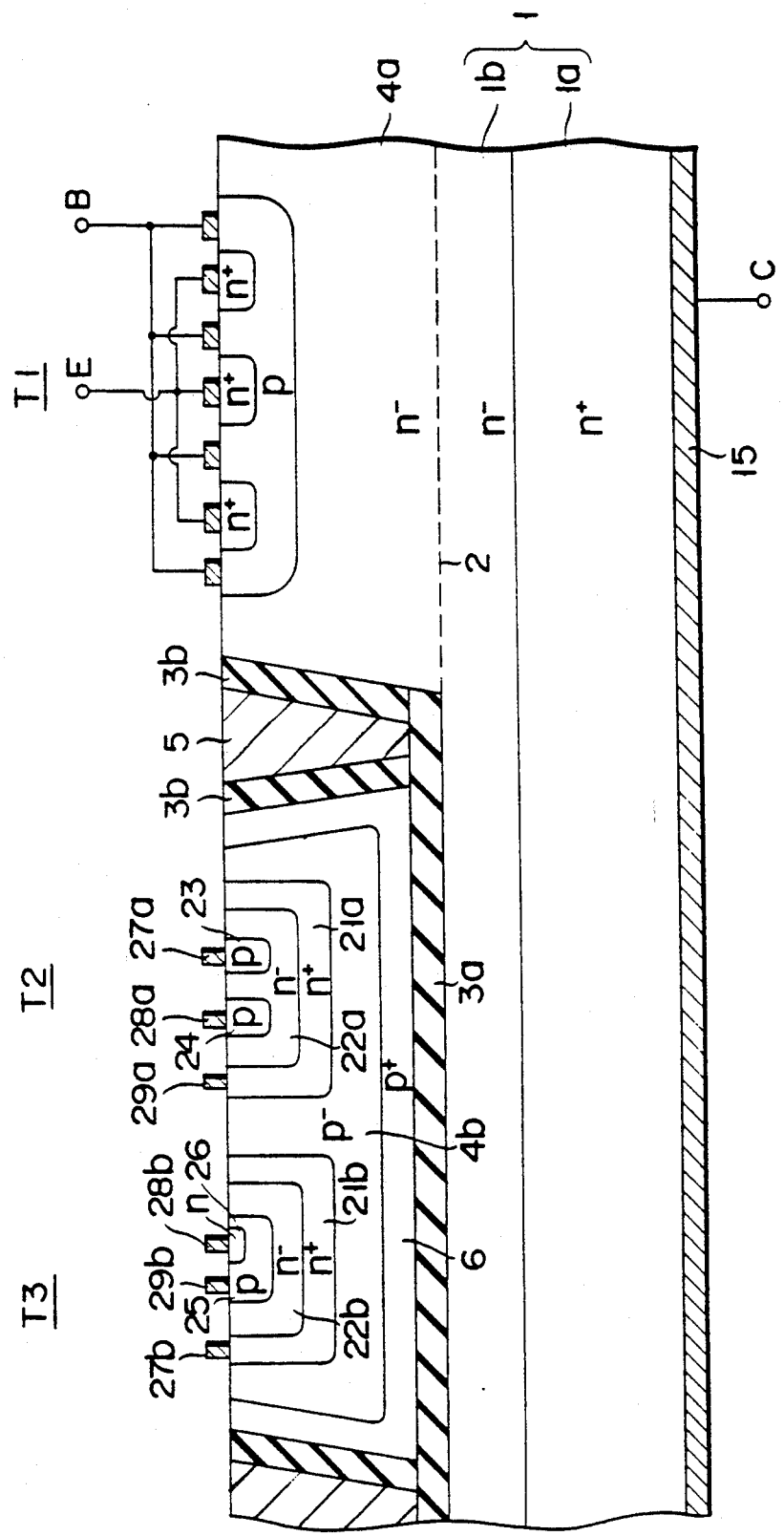

FIG. 29B shows an embodiment wherein npn transistor T1 is used in place of vertical type MOSFET-T1 in FIG. 29A. Npn transistor can be used in place of npn transistor.

Figure 29C:
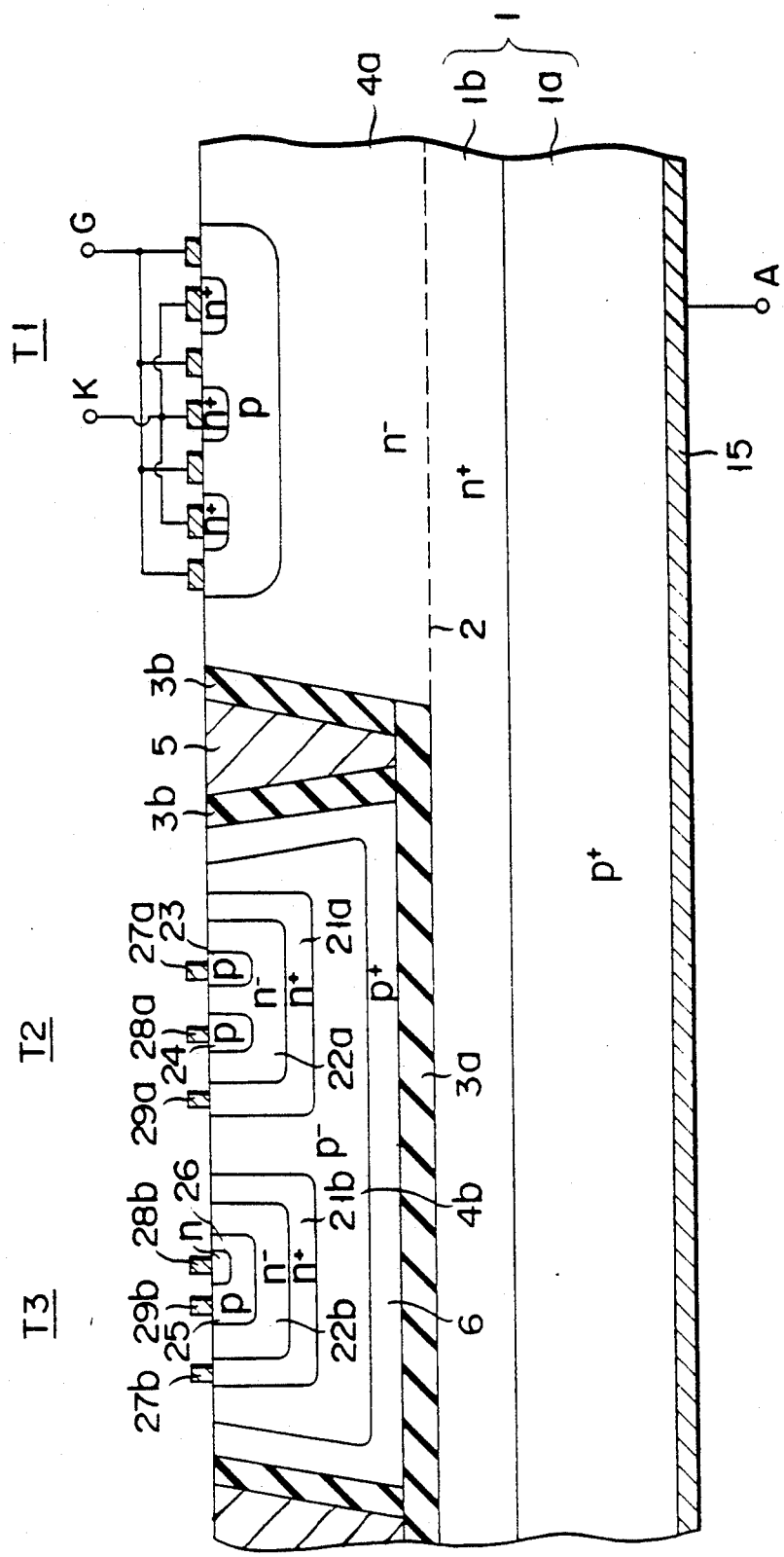

FIG. 29C shows an embodiment wherein GTO (gate turn-off off thyristor) is used in place of vertical type MOSFET-T1 in FIG. 29A. Thyristor or MOSGTO can be used in place of GTO.

In these embodiments shown in FIGS. 29A to 29C, the same effects as in the previous embodiment can be obtained.

Figure 30:
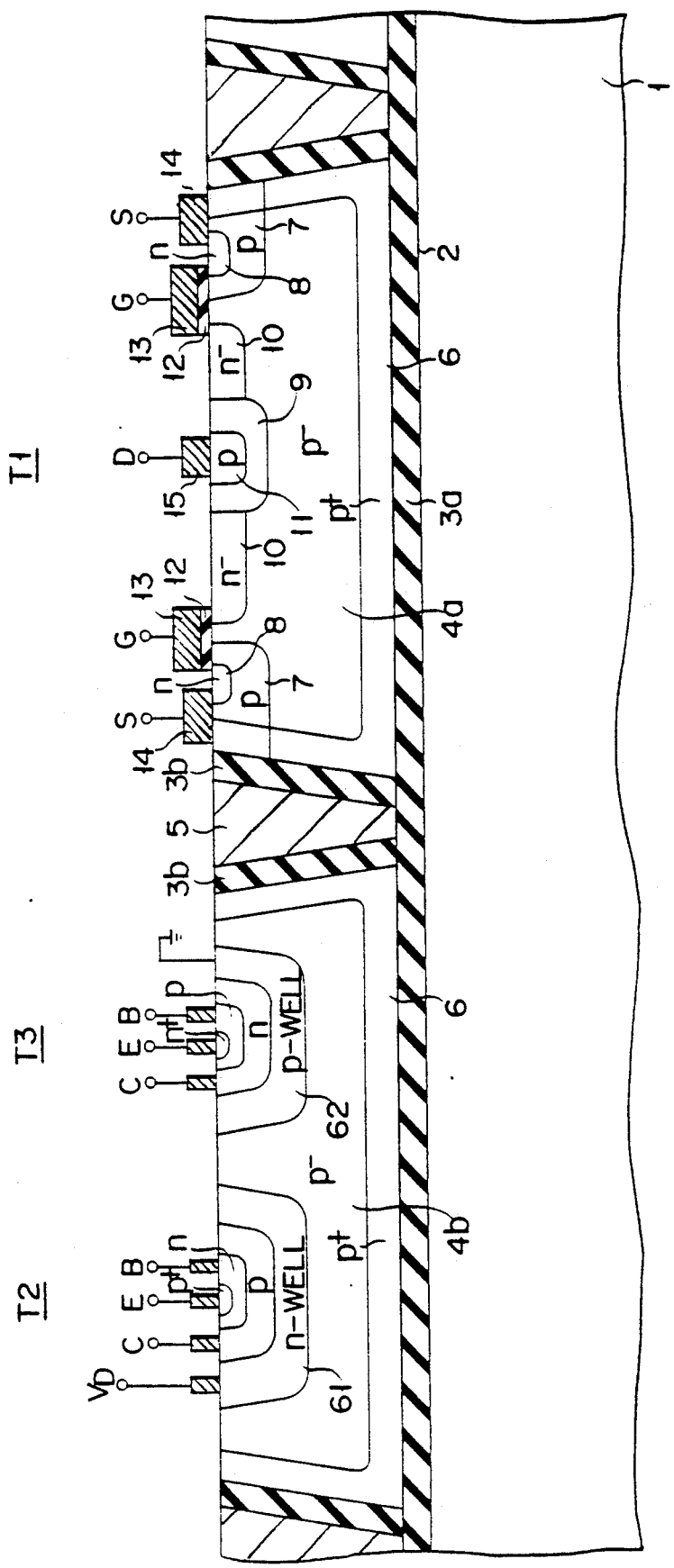
FIGS. 30 to 33 are sectional views of semiconductor devices in which an arrangement of low breakdown voltage elements is variously changed.
Figure 31:
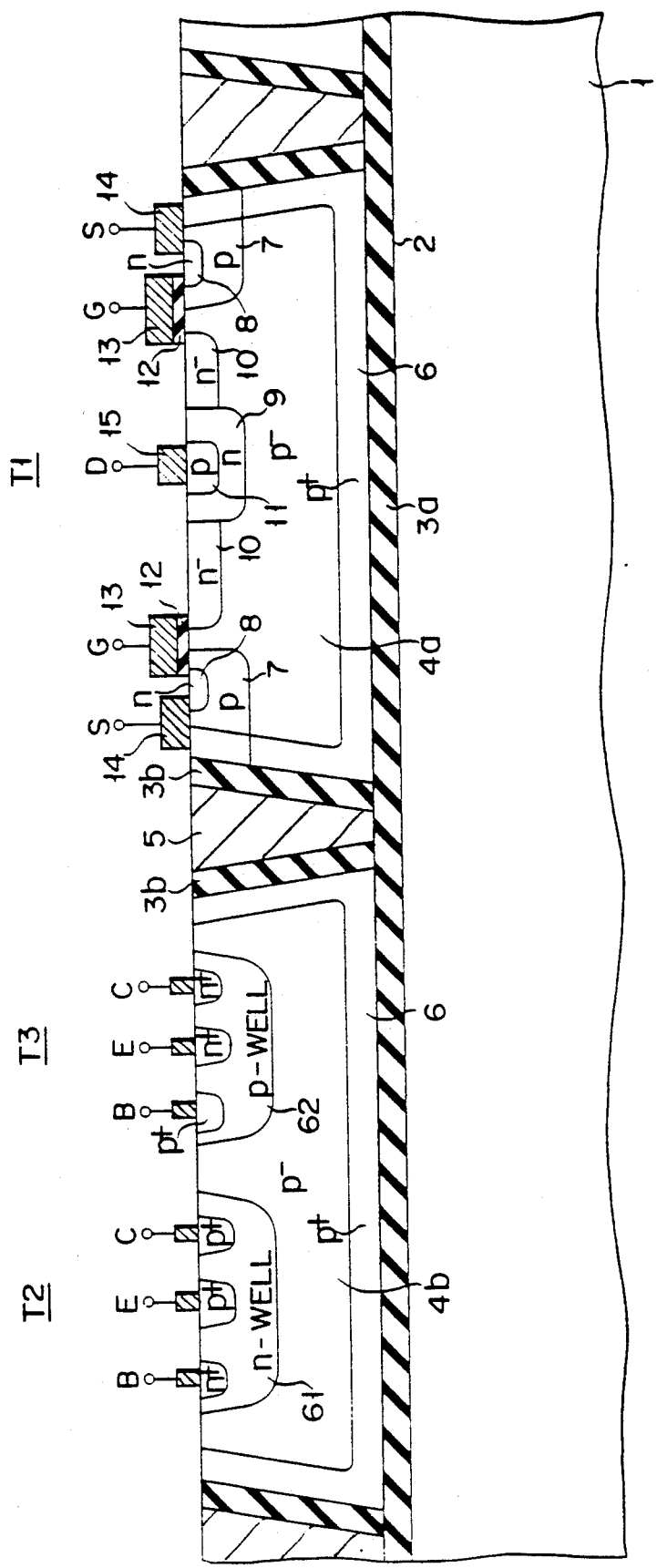
Figure 32:
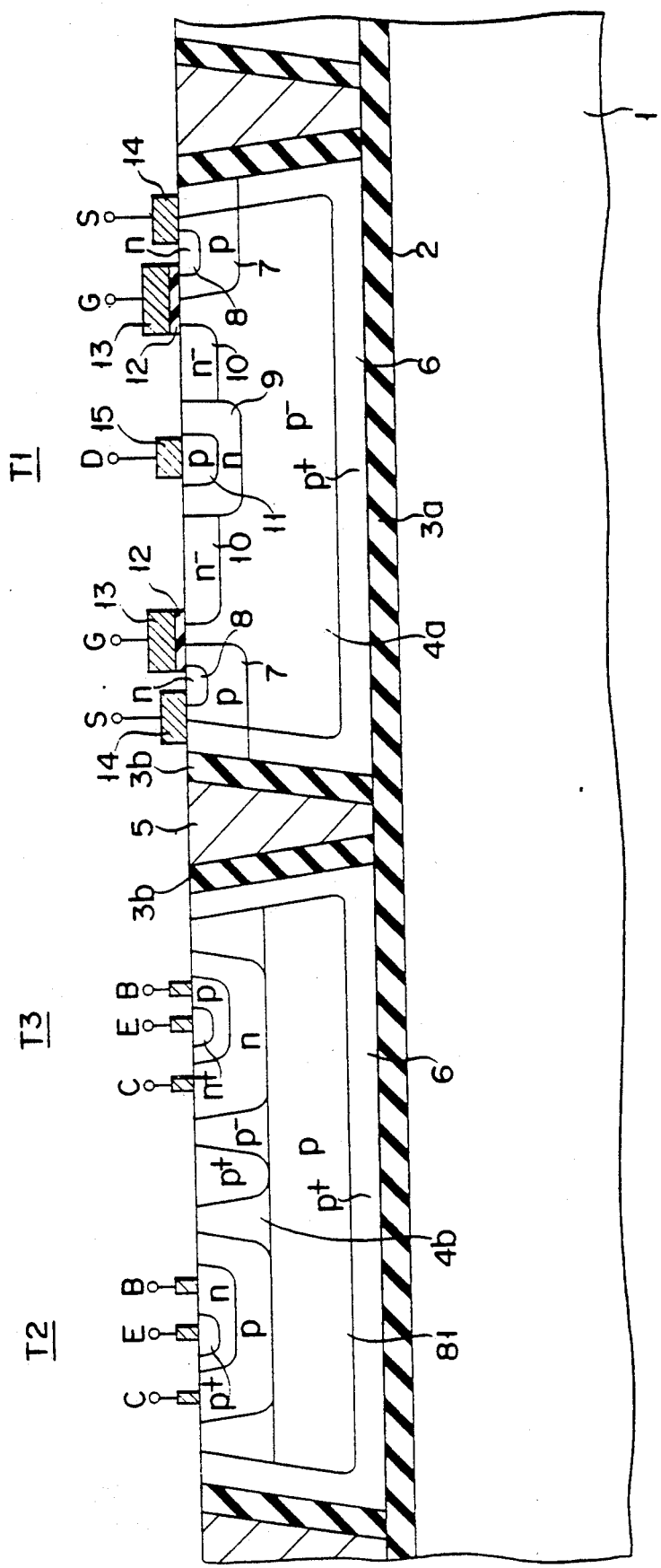
Figure 33:
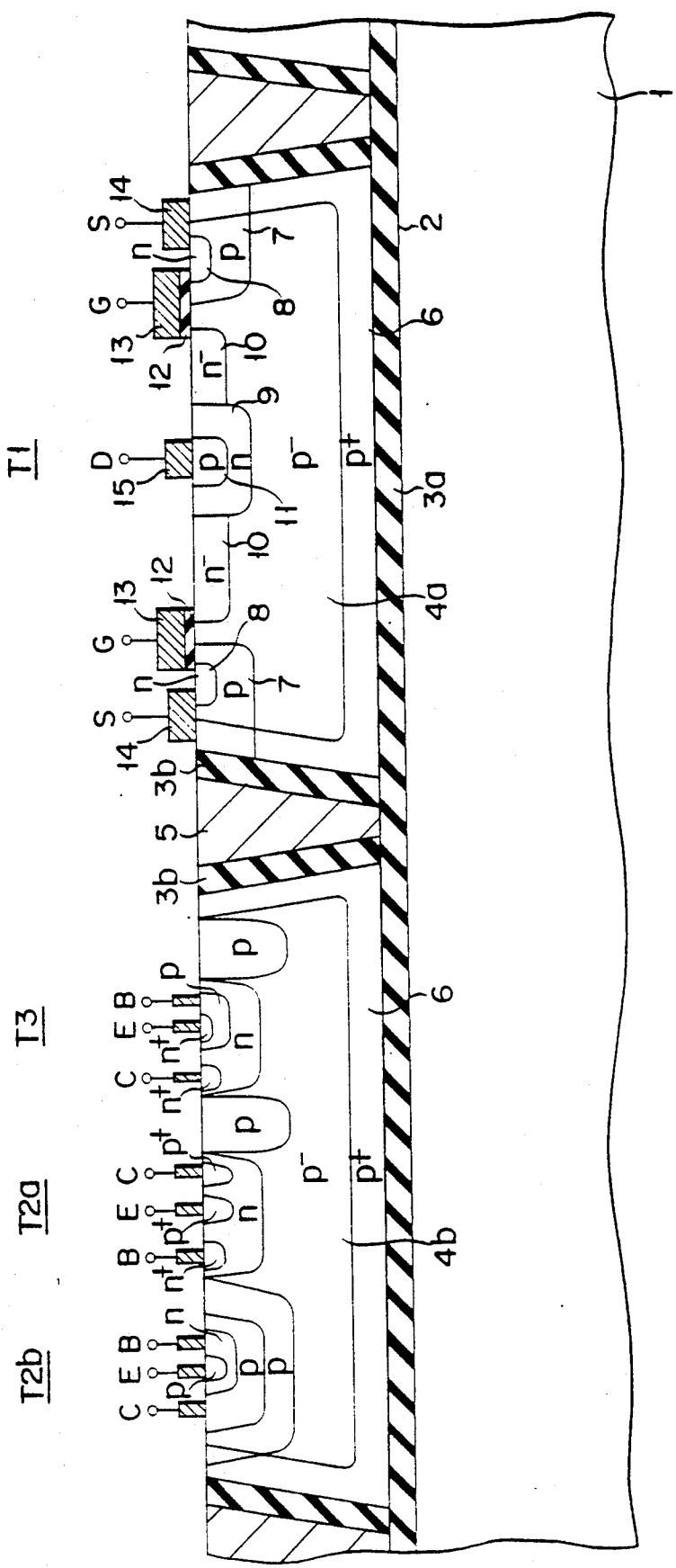

FIGS. 30 to 33 show embodiments wherein the arrangement of the bipolar transistor portions serving as low breakdown voltage elements is modified. In FIG. 30, $p^-$-type layer 46, n-type well 61, and p-type well are formed by impurity diffusion, and a collector, a base and an emitter are sequentially formed in the respective wells by impurity diffusion, thereby forming pnp and npn transistors T2 and T3. In FIG. 31, n- and p-type wells 61 and 62 are formed by diffusion, and hence lateral type pnp and npn transistors T2 and T3 are respectively formed therein. In FIG. 32, p-type layer 81 is formed in $p^-$-type layer 4b independently of $p^+$-type layer 6 prior to substrate bonding so as to reduce the resistance. In FIG. 33, lateral type transistor T2a and vertical type transistor T2b are simultaneously integrated as pnp transistors.

In the embodiments shown in FIGS. 30 to 33, the same effects as in the previous embodiment can be obtained.

Figure 34:
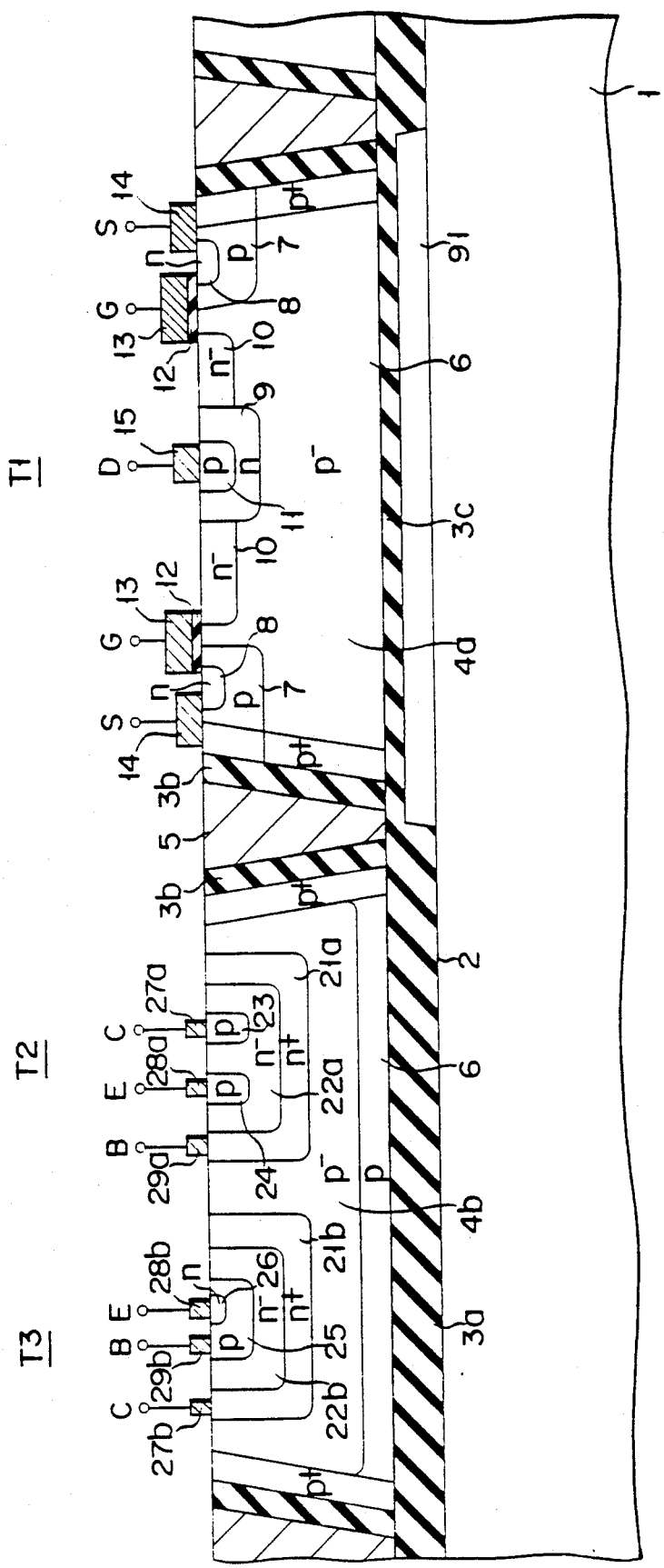
FIG. 34 is a sectional view of a semiconductor device in which a space is formed in a part of a bonding interface of a substrate.

FIG. 34 shows a structure of still another embodiment. In this embodiment, space 91 is formed at a position of bonding interface 2 below the IGBT-T1 region serving as the high breakdown voltage element in FIG. 25. This structure is obtained by forming oxide film 3a to a sufficient thickness by a process prior to bonding, etching oxide film 3a in the high breakdown voltage element region, forming thin oxide film 3c in the etched portion again, and performing bonding. With this structure a breakdown voltage in a bottom portion of the high breakdown voltage element side can be further increased.

Figure 35:
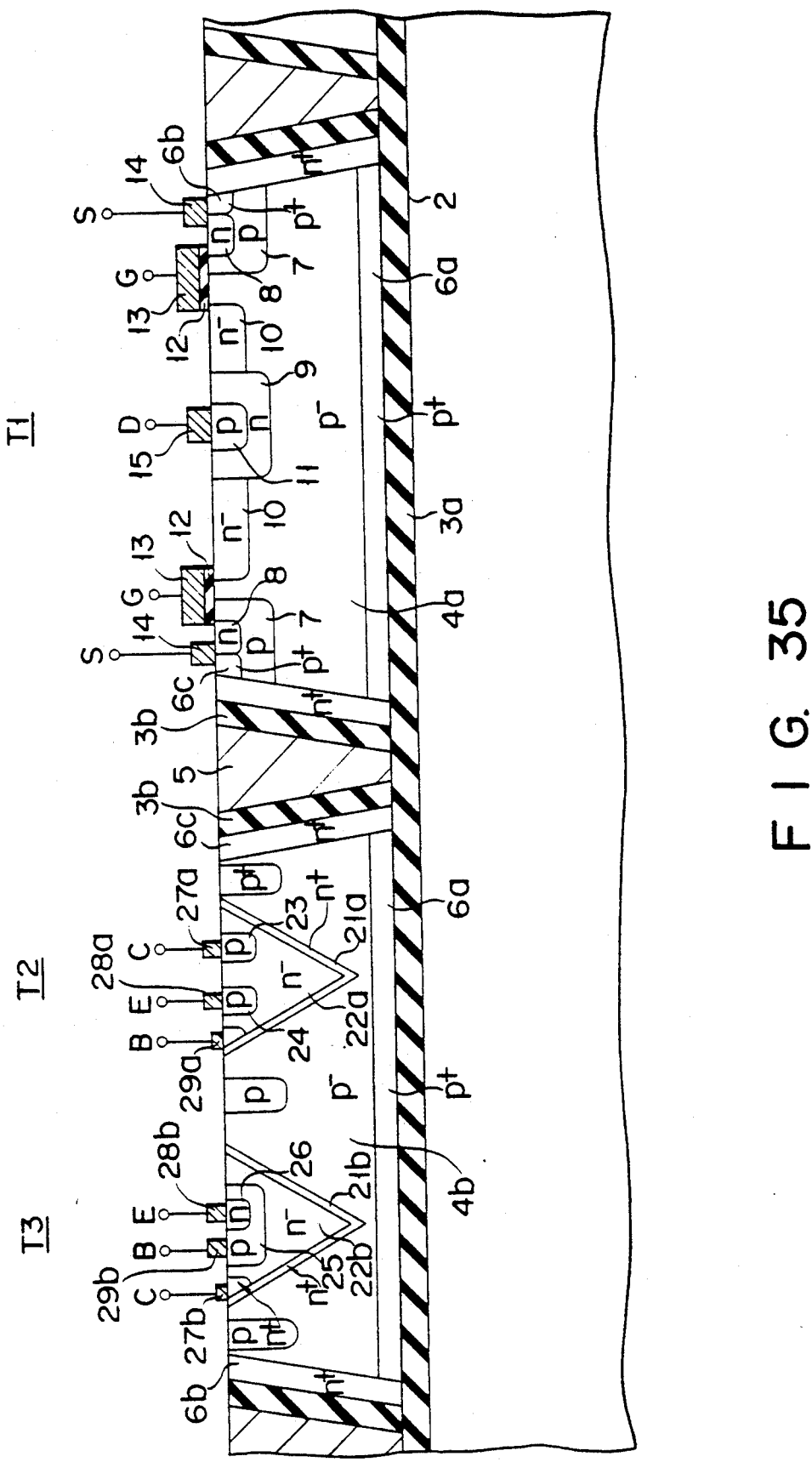
FIG. 35 is a sectional view of a semiconductor device in which a formation region of low breakdown voltage elements is formed simultaneously with formation of a trench for isolation.

FIG. 35 is a sectional view of a semiconductor device in which low breakdown voltage elements are formed in two wells having V-shaped sectional areas. In the above-described embodiments, the method of forming a trench and burying a semiconductor layer therein, and the method of impurity diffusion are described as methods of forming wells isolated by pn junction isolation. The method of forming trenches described with reference to FIGS. 26A to 26G is performed independently of the selective etching process for forming island Si layers by isolation. In this embodiment, however, trenches are formed in the wells simultaneously with the selective etching process for isolation of the island Si layers. The trenches for isolating/forming the island layers must reach the bottom portions while the trenches in the well regions must not reach the bottom portions. Such conditions can be obtained by applying anisotropic etching capable of obtaining a predetermined determined taper angle to selective etching so as to select the size of an etching window.

FIGS. 36A to 36G are sectional views showing the steps in manufacturing the semiconductor device in FIG. 35. The steps shown in FIGS. 36A and 36B are the same as those in FIGS. 26A and 26B. Si layer 4a on the high breakdown voltage element side and Si layer 4b on the low breakdown voltage element side are isolated from each other by forming isolation trench 32 by selective etching. At the same time, trenches 32a and 32b are formed in the well regions on the low breakdown voltage element side (FIG. 36C). By selecting the size of a window of SiO2 upon anisotropic etching, trench 32 of the isolation region can be caused to reach the bottom portion while trenches 32a and 32b in the well regions do not reach the bottom portions. Thereafter, n+-type layers 6c, 21a, and 21b are formed in the side walls of trenches 32, 32a, and 32b upon diffusion of phosphorus or arsenic by epitaxial diffusion (FIG. 36D). Similar to the embodiment shown in FIGS. 26A to 26G, high-resistance n−-type Si layer 22 is formed by removing an oxide film on the low breakdown voltage element side and forming an Si layer by epitaxial growth. At the same time, polysilicon layer 5 is deposited on the high breakdown voltage element covered with the oxide film (FIG. 36E). Then, the grown layer is lapped, n−-type layers 22a and 22b serving as wells are buried in the respective recesses in Si layer 4, and polysilicon layer 5 is buried in the isolation trench (FIG. 36F). Thereafter, in an element forming process, IGBT-T1 is formed in Si layer 4a, and lateral type pnp transistor T2 and vertical type npn transistor T3 which are isolated from each other by a pn junction isolation are formed in Si layer 4b (FIG. 36G).

According to this embodiment, since isolation of the island Si layers and formation of the recesses in the well formation regions in the Si layers can be performed in a single etching process, the overall process can be simplified.

Figure 37:
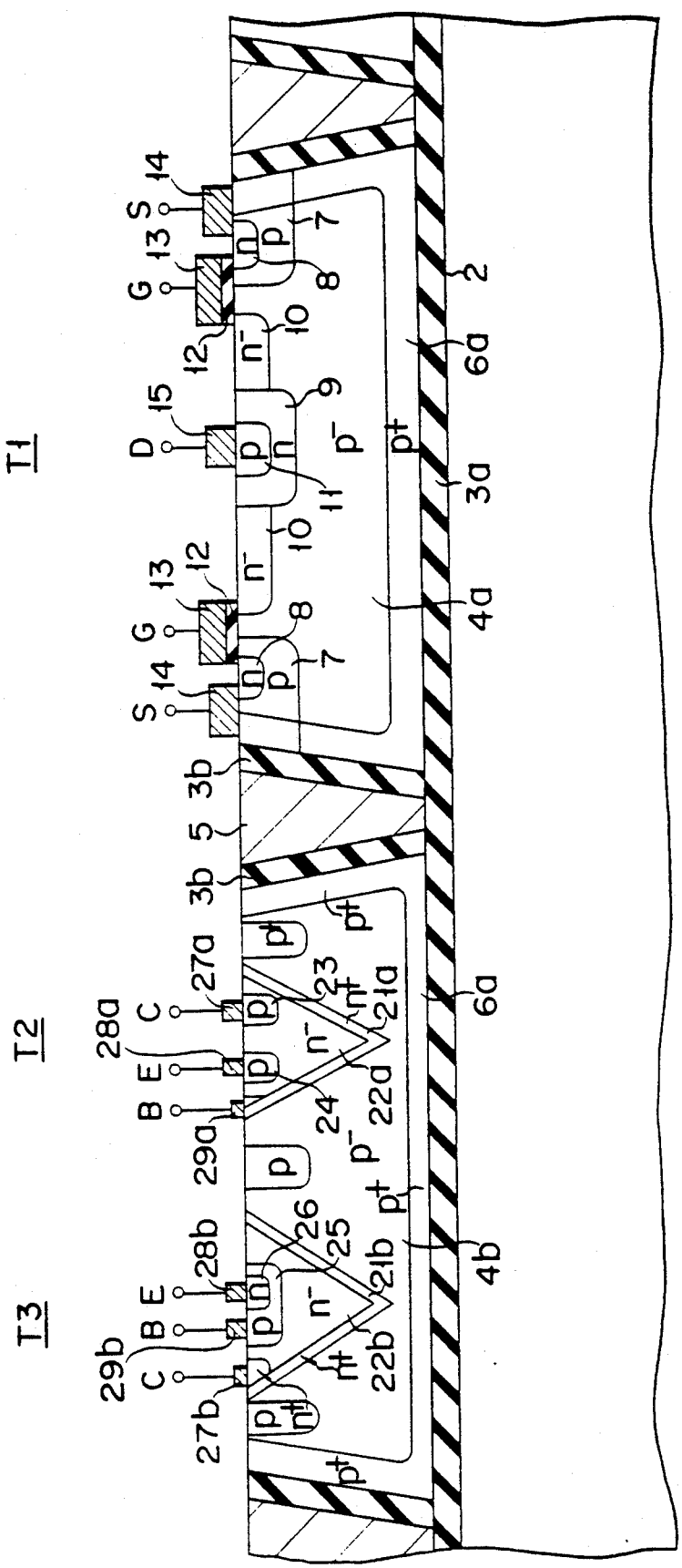
FIGS. 37 and 38 are sectional view of semiconductor devices as modifications of the device in FIG. 11.

FIG. 37 shows an embodiment wherein the structure in FIG. 35 is slightly modified. In FIG. 35, p+-type layers 6a are formed in the bottom portions of Si layers 4a and 4b, and n+-type layers 6c are formed on the side walls of the isolation trench simultaneously with formation of the n+-type layers on the side surfaces of the well region trenches. In this embodiment, however, the p+-type layers are formed on the bottom and side walls of the island Si layers.

Figure 38:
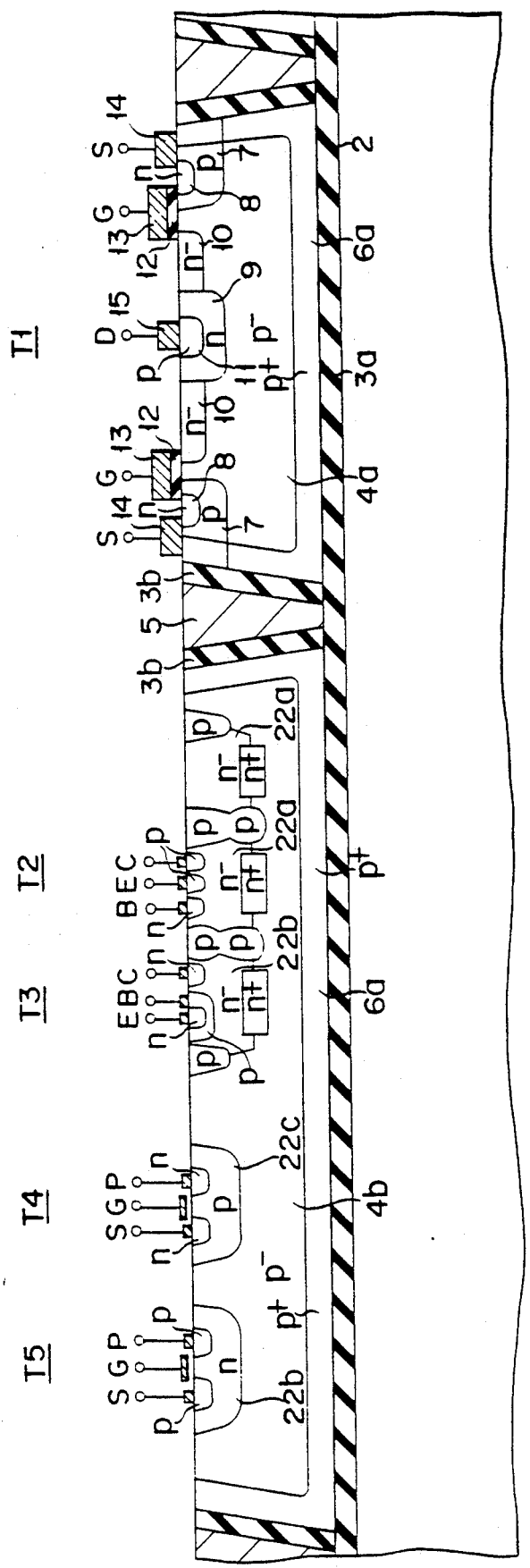

FIG. 38 shows a structure of still another embodiment. In this embodiment, n- and p-channel MOS transistors T4 and T5 constituting a CMOS circuit together with bipolar transistors T2 and T3 are formed in Si layer 4b on the low breakdown voltage element side. Bipolar transistors T2 and T3 are formed such that n−-type layer 22a formed by epitaxial growth is divided into a plurality of regions which are isolated from each other by a pn junction isolation, and transistors T2 and T3 are respectively formed in the regions. MOS transistors T4 and T5 are respectively formed in p- and n-type layers 22c and 22b formed by impurity diffusion.

In the embodiment shown in FIGS. 26A to 26G, and also the embodiment shown in FIGS. 36A to 36G, a p+-type layer and an n+-type layer are formed on the inner surface of trench 32 shown in FIGS. 26C and 36D, and SiO2 film 31, which has been used as the mask, is then removed by means or etching. When SiO2 film 31 is removed away, SiO2 film 3a is inevitably etched away from the bottom of trench 32 as is shown in FIG. 39A. At the same time, the side etching of SiO2 film 3a also proceeds. Thereafter, as is shown in FIG. 39B, SiO2 film 3b is formed on the inner surface of trench 32 by means of thermal oxidation. The thickness of SiO2 film 3a is determined by the breakdown voltage which is required of the interface between two Si substrates 1 and 4. On the other hand, the thickness of SiO2 film 3b is determined by the breakdown voltage which is required of the interface between island-shaped Si layers 4a and 4b. The breakdown voltage required of the interface between two Si substrates 1 and 4 is equal, in most cases, to that required of the interface between island-shaped Si layers 4a and 4b. Nonetheless, SiO2 film 3b is thinner than SiO2 film 3a since it is this SiO2 film 3b that isolates island-shaped Si layers 4a and 4b from each other.

Since SiO2 film 3b is thinner than SiO2 film 3a, SiO2 film 3a is etched away from the bottom of trench 32 when SiO2 film 31 is etched away. Consequently, SiO2-film 3b formed on the bottom of trench 32 by thermal oxidation is thinner than SiO2 film 3a. The side-etched portion of SiO2 film 3a is particularly thin. SiO2 film 3b formed on the bottom of trench 32, which is thin, is electrically weak, and fails to have a breakdown voltage as high as is desired.

This problem can be solved by making SiO2 film 3b, that is formed on the inner surface of trench 32, thicker than SiO2 film 3a formed between two Si substrates 1 and 4. In fact, when SiO2 film 3b was made 1.5 μm thick, whereas SiO2 film 3a was made 1 μm thick, as is shown in FIG. 15C, the breakdown voltage of the interface between Si substrates 1 and 4 was as high as 700 to 800V. By contrast, when SiO2 film 3b was made 0.8 μm thick, while SiO2 film 3a was made 1 μm thick, the breakdown voltage of the interface between Si substrates 1 and 4 was only 500V to 600V.

As has been described above, according to the present invention, in an integrated circuit in which high and low breakdown voltage elements coexist, a dielectric isolation structure and a pn junction isolation structure are combined so that the integration density can be sufficiently increased while influences of noise and the like due to large current switching are effectively prevented.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:
1. A semiconductor device, comprising:
   a composite substrate formed comprising a first semiconductor substrate serving as an element region bonded to a second semiconductor substrate serving as a supporting member with a first insulating film interposed therebetween;
   a plurality of low breakdown voltage elements formed in said first semiconductor substrate; and
   a high breakdown voltage element formed in said first semiconductor substrate;
   said first semiconductor substrate comprising first and second island regions which are isolated from each other by a dielectric material in a first groove, said second island region including a plurality of element regions, said high breakdown voltage element being formed in said first island region, said low breakdown voltage elements being formed in said second island region, said second island region comprising an isolated region which is isolated from the remainder of said second island region by a dielectric material in a second groove, and at least one of said low breakdown voltage elements being formed in said isolated region; and a high impurity concentration region being formed over an entire side surface of at least one of said first and second grooves.

2. A semiconductor device according to claim 1, wherein at least one of said low breakdown voltage elements comprises a bipolar transistor.

3. A semiconductor device according to claim 1, wherein said second island region has a high impurity concentration region embedded therein.

4. A semiconductor device according to claim 1, wherein said low breakdown element formed in said isolated region comprises a MOS transistor.

5. A semiconductor device according to claim 1, wherein said low breakdown element formed in said isolated region comprises a CMOS transistor.

6. A semiconductor device according to claim 1, wherein a bipolar transistor and a MOS transistor are formed in said second island region.

7. A semiconductor device, comprising:
a composite substrate comprising a first semiconductor substrate serving as an element region directly bonded to a second semiconductor substrate serving as a supporting member with a first insulating film interposed therebetween;
a plurality of low breakdown voltage elements formed in said first semiconductor substrate;
a high breakdown voltage element formed in said first semiconductor substrate;
said first semiconductor substrate comprising first and second island regions which are isolated from each other by a dielectric material in a first groove, said high breakdown voltage element being formed in said first island region, said low breakdown voltage elements being formed in said second island region, said second island region comprising an isolated region which is isolated from the remainder of said second island region by a dielectric material in a second groove, and at least one of said low breakdown voltage elements is formed in said isolated region; and
a high impurity concentration region being formed over an entire side surface of at least one of said first and second grooves.

8. A semiconductor device according to claim 7, wherein at least one of said low breakdown voltage elements comprises a bipolar transistor.

9. A semiconductor device according to claim 7, wherein said second island region has a high impurity concentration region embedded therein.

10. A semiconductor device according to claim 7, wherein said low breakdown element formed in said isolated region comprises a MOS transistor.

11. A semiconductor device according to claim 7, wherein said low breakdown element formed in said isolated region comprises a CMOS transistor.

12. A semiconductor device according to claim 7, wherein a bipolar transistor and a MOS transistor are formed in said second island region.

13. A semiconductor device according to claim 7, comprising well regions having different conductivity types formed in said isolated regions.

14. A semiconductor device according to claim 7, comprising layers having different conductivity types formed on said isolated region.

15. A semiconductor device, comprising:
a composite substrate comprising a first semiconductor substrate serving as an element region directly bonded to a second semiconductor substrate serving as a supporting member with a first insulating film interposed therebetween;
a plurality of low breakdown voltage elements formed in said first semiconductor substrate; and
a high breakdown voltage element formed in said first semiconductor substrate;
said first semiconductor substrate being divided into first and second island regions which are isolated from each other by a dielectric material in a first groove, said second island region including a plurality of element regions, said high breakdown voltage element region being formed in said first island region, and said low breakdown voltage elements being formed in said second island region and isolated from one-another by a dielectric material in a second groove; and a high impurity concentration being formed over an entire side surface of at least one of said first and second grooves.

16. A semiconductor device according to claim 15, wherein at least one of said low breakdown voltage elements comprises a bipolar transistor.

17. A semiconductor device according to claim 15, wherein said second island region has a high impurity concentration region embedded therein.

18. A semiconductor device according to claim 1, wherein said high impurity concentration region is formed on a side surface of said first groove.

19. A semiconductor device according to claim 1, wherein said high impurity concentration region is formed on a side surface of said second groove.

20. A semiconductor device according to claim 1, wherein said high impurity concentration region is formed on side surfaces of said first and second grooves.

21. A semiconductor device according to claim 7, wherein said high impurity concentration region is formed on a side surface of said first groove.

22. A semiconductor device according to claim 7, wherein said high impurity concentration region is formed on a side surface of said second groove.

23. A semiconductor device according to claim 7, wherein said high impurity concentration region is formed on side surfaces of said first and second grooves.

24. A semiconductor device according to claim 15, wherein said high impurity concentration region is formed on a side surface of said first groove.

25. A semiconductor device according to claim 15, wherein said high impurity concentration region is formed on a side surface of said second groove.

26. A semiconductor device according to claim 15, wherein said high impurity concentration region is formed on side surfaces of said first and second grooves.

* * * * *